(12) United States Patent
Iwaki et al.

(10) Patent No.: US 7,788,076 B2
(45) Date of Patent: Aug. 31, 2010

(54) INTERFERENCE ANALYSIS METHOD, INTERFERENCE ANALYSIS DEVICE, INTERFERENCE ANALYSIS PROGRAM AND RECORDING MEDIUM WITH INTERFERENCE ANALYSIS PROGRAM RECORDED THEREON

(75) Inventors: Hideki Iwaki, Ibaraki (JP); Tetsuyoshi Ogura, Settsu (JP); Naoki Komatsu, Moriguchi (JP); Takeshi Nakayama, Katano (JP); Tomohiro Kinoshita, Katano (JP)

(73) Assignee: Panasonic Corporation, Osaka (JP)

( * ) Notice: Subject to any disclaimer, the term of this patent is extended or adjusted under 35 U.S.C. 154(b) by 984 days.

(21) Appl. No.: 11/076,212

(22) Filed: Mar. 8, 2005

(65) Prior Publication Data

US 2005/0197817 A1    Sep. 8, 2005

(30) Foreign Application Priority Data

Mar. 8, 2004    (JP) .............................. 2004-063520

(51) Int. Cl.
*G06F 17/50* (2006.01)
(52) U.S. Cl. .............................. 703/13; 703/14; 716/4; 716/5
(58) Field of Classification Search .................. 703/13, 703/14; 716/4, 5
See application file for complete search history.

(56) References Cited

U.S. PATENT DOCUMENTS

| | | | | |
|---|---|---|---|---|
| 5,559,997 | A * | 9/1996 | Tsuchida et al. ................ | 716/1 |
| 6,072,947 | A * | 6/2000 | Roychowdhury et al. ..... | 703/14 |
| 6,135,649 | A * | 10/2000 | Feldmann et al. ............. | 703/14 |
| 6,212,490 | B1 * | 4/2001 | Li et al. ......................... | 703/14 |
| 6,378,109 | B1 | 4/2002 | Young et al. | |
| 6,810,340 | B2 | 10/2004 | Shimazaki et al. | |
| 6,915,249 | B1 * | 7/2005 | Sato et al. ...................... | 703/14 |

(Continued)

FOREIGN PATENT DOCUMENTS

EP    1 083 502    3/2001

(Continued)

OTHER PUBLICATIONS

Tripathi, et al., "A Configuration-Oriented Spice Model for Multiconductor Transmission Lines in an Inhomogeneous Medium", Transactions on Microwave Theory and Techniques, vol. 46, No. 12, Dec. 1998, pp. 1997-2005.

*Primary Examiner*—Jason Proctor
(74) *Attorney, Agent, or Firm*—Hamre, Schumann, Mueller & Larson, P.C.

(57) ABSTRACT

An interference analysis device can be provided, which analyzes interference between wirings of a circuit board with reduced load and for a short time period. The interference analysis device according to the present invention includes: a design data input part for inputting design data of the circuit board; a noise characteristics setting part that sets data representing electrical characteristics of noise for a wiring of the circuit board; a limit value setting part that sets an allowable limit value of noise received by a wiring; a selection part that selects a wiring group to be analyzed based on the noise characteristics data and the allowable limit value; an interference analysis part that calculates, concerning the selected wiring group, an amount of interference from a wiring giving the interference to a wiring receiving the interference; and a received noise level calculation part that calculates a noise level that the wiring receiving the interference will receive.

15 Claims, 11 Drawing Sheets

U.S. PATENT DOCUMENTS

| | | |
|---|---|---|
| 2001/0044709 A1 | 11/2001 | Fujimori et al. |
| 2002/0040466 A1 | 4/2002 | Khazei |
| 2002/0147553 A1 | 10/2002 | Shimazaki et al. |
| 2003/0182640 A1 | 9/2003 | Alani et al. |

FOREIGN PATENT DOCUMENTS

| | | |
|---|---|---|
| JP | 2000-35984 | 2/2000 |
| JP | 2002-270695 | 9/2002 |

* cited by examiner

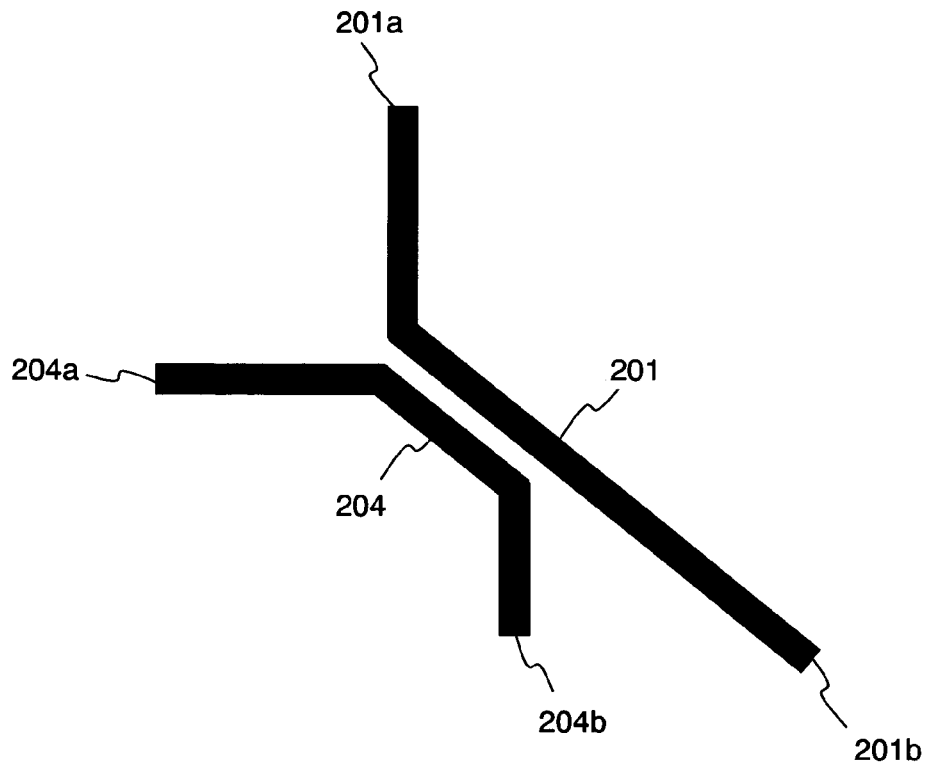
F I G. 7A
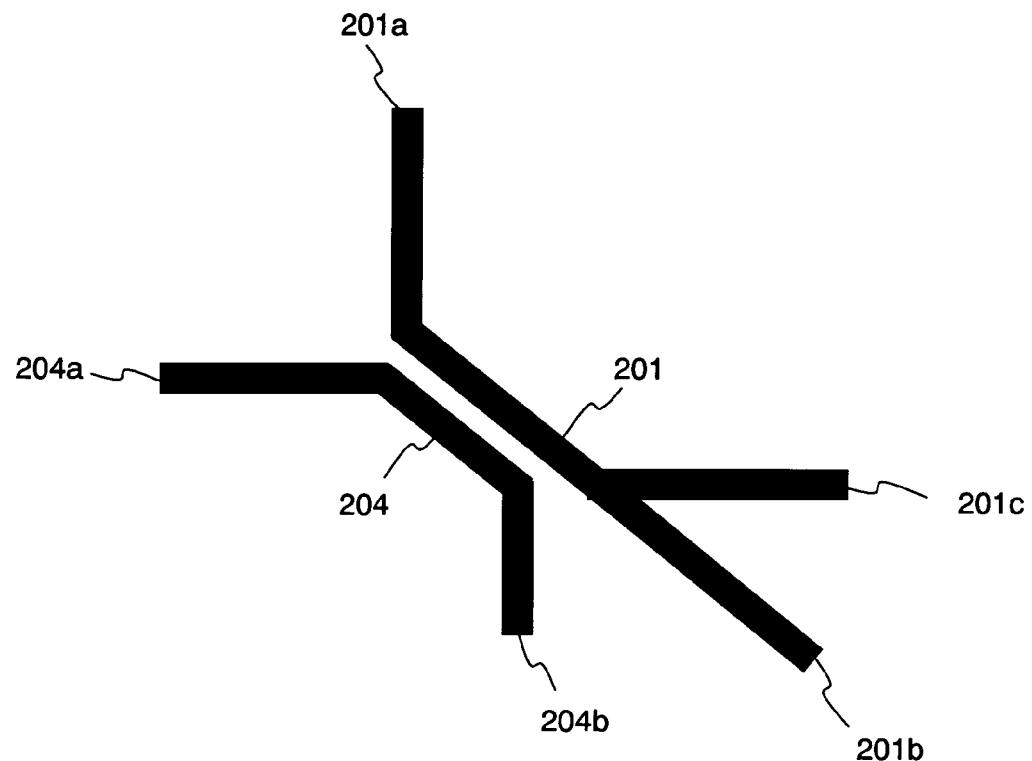
F I G. 7B

INTERFERENCE ANALYSIS METHOD, INTERFERENCE ANALYSIS DEVICE, INTERFERENCE ANALYSIS PROGRAM AND RECORDING MEDIUM WITH INTERFERENCE ANALYSIS PROGRAM RECORDED THEREON

BACKGROUND OF THE INVENTION

1. Field of the Invention

The present invention relates to a method and a device for analyzing mutual interference due to electromagnetic induction between wirings formed in a circuit board by a computer and investigating an influence thereof. The present invention also relates to a program making a computer execute such an analysis procedure and a recording medium with the program recorded thereon.

2. Related Background Art

Conventionally, as methods and devices for analyzing mutual interference due to electromagnetic induction between wirings formed in a circuit board and investigating an influence thereof, a noise checking method and such a device described in JP2000-035984A, for example, are available.

FIG. 9 is a flowchart showing the outline procedure of conventional digital circuit design.

According to this design process, firstly, basic specifications are designed (S911). The design of the basic specifications does not involve the specific configurations of the circuit and elements and the layout of the elements. Rather, specifications required for the circuit to be designed and basic requirements for implementing the required specifications are selected and determined.

After the design of the basic specifications has been finished, based on these basic specifications, component values are set and the specific circuit configuration is designed for implementing the basic specifications (S912).

At this stage, designing resources and know-how of the past stored in the design and development department are exploited (S921).

These designing resources and know-how are stored normally in such a manner that the accumulation of past experiences and knowledge of a group and individuals is described as a document form, or such experiences and knowledge may be accumulated as tacit understanding that is not in document form.

After the setting of the specific component values and the design of the specific circuit configuration have been finished based on the basic specifications, then the layout of components and the wirings between the components are designed (S913).

At this time, in many cases, the group and persons who are in charge of the above setting of the specific component values and the design of the specific circuit configuration (S912) are different from the group and persons who are in charge of the design of the specific component layout and the wirings between the components (S913). Therefore, in order to allow such different groups and persons to share the knowledge so as to ensure the suitability and the accuracy of the design, a design instruction form (S922) is used often for the specific layout of the components and the design of the wirings between the components, where matters to be noted and to be followed are described in the design instruction form. The main contents of this design instruction form are information based on the past designing resources and know-how and information depending on specific design targets.

After the layout of the components and the design of the wirings between components have been finished, then the verification thereof is performed (S914).

A large amount of know-how (S923) is exploited also for this verification. Similarly to the above-stated past designing resources and know-how (S921), this know-how (S923) also is stored in such a manner that the accumulation of past experiences and knowledge of a group and individuals is described as a document form or such experiences and knowledge may be accumulated as tacit understanding that is not in document form.

If nonconforming parts are found by this verification (S914) (in the case of NG in S914), a modification instruction form is created (S931) and the setting of component values and the circuit design (S912) or the layout of components and the design of the wirings between components (S913) are performed again.

The modification instruction form (S931) is a document containing: information on the parts decided as nonconforming by the verification (S914); the data indicating the reason for the decision; matters to be noted for the modification; and other various information. That is to say, the modification instruction form (S931) is rich in information useful for performing again the setting of component values and the circuit design (S912) and the layout of components and the design of the wirings between components (S913) more appropriately and accurately. Such a modification instruction form (S931) also is created, in many cases, based on the past designing resources and know-how as stated above.

Based on this modification instruction form (S931) and depending on the types of the nonconformance found by the verification (S914), a determination is made as to whether the design procedure should return to the step of the setting of component values and the circuit design (S912) or the step of the layout of components and the design of the wirings between components (S913).

If nonconforming parts are not found by the verification (S914) (in the case of OK in S914), then a prototype is manufactured and is evaluated (S915).

While the verification (S914) is performed mainly by simulation using a computer, the verification at this step of manufacturing a prototype and its evaluation (S915) or later is performed using an actually manufactured circuit.

Also for this prototyping and its evaluation, many designing resources and know-how are exploited in some cases.

After the prototyping and its rough theoretical evaluation (S915) have been finished, then the prototype is activated actually so as to carry out the verification (S916).

Also for this verification, a large amount of know-how (S924) is exploited. Similarly to the above know-how (S923), this know-how (S924) also is stored in such a manner that the accumulation of past experiences and knowledge of a group and individuals is described as a document form or such experiences and knowledge may be accumulated as tacit understanding that is not in document form.

If nonconforming parts are found by this verification (S916) (in the case of NG in S916), a modification instruction form is created (S932) and the setting of component values and the circuit design (S912) or the layout of components and the design of the wirings between components (S913) are performed again.

Similarly to the modification instruction form (S931) created when the nonconformance is decided by the verification (S914), the modification instruction form (S932) is a document containing: information concerning the parts decided as nonconforming by the verification (S916); the data indicating the reason for the decision; matters to be noted for the modification; and other various information. The modification instruction form (S932) is rich in information useful for performing again the setting of component values and the circuit design (S912) and the layout of components and the design of the wirings between components (S913) more appropriately and accurately. Such a modification instruction form (S932) also is created, in many cases, based on the past designing resources and know-how as stated above.

Based on this modification instruction form (S932), and depending on the types of the nonconformance found by the verification (S916), a determination is made as to whether the design procedure should return to the step of the setting of component values and the circuit design (S912) or the step of the layout of components and the design of the wirings between components (S913). This is the same as the decision by the verification (S914) as nonconforming.

If nonconforming parts are not found by the verification (S916) (in the case of OK in S916), then the procedure goes to a mass production stage (S917) so as to complete the design procedure for the digital circuit.

When designing a high-frequency circuit with the procedure shown in FIG. 9, a serious problem occurs, called interferences due to electromagnetic induction between wirings.

When a high-frequency current flows through one wiring, a magnetic field is generated around the wiring. Along with the variation of the current at high frequencies, the magnetic field also is varied, whereby an electromotive force occurs in adjacent wirings. In other words, a signal passing through one wiring affects signals passing through adjacent wirings as noise. This is a problem of the interference between wirings.

This influence of the interference increases with increasing frequency of the current flowing through the wiring and with increasing proximity between two wirings.

Meanwhile, there are demands for electronic circuits realizing a speedy operation and miniaturization. Therefore, the electronic circuits in recent years operate at significantly high oscillation frequencies for realizing the speedy operation and are densely packaged for realizing the miniaturization. In such an electronic circuit with a high frequency current flowing through the wirings thereon and with a short distance between the wirings, the influence of the interference between wirings is considerable, thus posing a serious challenge.

FIG. 10 schematically shows an example of a portion of a high frequency electronic circuit, in which the interference may occur.

The high frequency electronic circuit shown in FIG. 10 is, for example, a part of a mobile phone, where an LSI component 955, an LSI component 956, a camera module 959 and a high frequency circuit module 954 are mounted on a board 950.

The high frequency circuit module 954 includes, as an example, an element 951 and an element 952.

The LSI component 955 and the LSI component 956 are connected via a wiring 958. An antenna 953 is connected with the high frequency circuit module 954 via a wiring 957.

The wiring 957 and the wiring 958 are disposed in close proximity to each other on the board 950 (or inside the board 950).

In such a high frequency electronic circuit, interference may occur, for example, between the wiring 957 and the wiring 958, between the element 951 and the element 952 and between the camera module 959 and the high frequency circuit module 954.

Further, in addition to between the wirings of the board 950 and between the components mounted thereon, the same problem may occur, for example, between wirings in one LSI chip and between cells connected with such wirings.

Especially, since the wirings and the cells in the LSI component 955 are arranged with a much higher density than the wirings and the components mounted on the print wiring board 950, the degree of the interference may be further increased in the former.

Thus, the design procedure shown in FIG. 9 is required to analyze the influence of the interference, e.g., between wirings by a computer at a stage before the manufacturing, for example, at the stage of the verification (S914) before prototyping.

As a conventionally available method for analyzing such mutual interference, there is a method of calculating the interference by a computer using a placement and routing CAD (computer-aided design) tool and an electromagnetic field analysis tool so as to obtain interference frequency characteristics as the analysis result.

The following describes a method of determining, by electromagnetic field analysis, an interference amount between wirings using a conventional electromagnetic field analysis tool. FIG. 11A shows an exemplary wiring pattern as a target of the analysis. A wiring pattern 1000 shown in FIG. 11A is so complicated that the electromagnetic field analysis cannot be performed for such a state of the wiring pattern. Thus, the wiring pattern 1000 is divided into a plurality of cells in a mesh form (2000) as shown in FIG. 11B. Each of the divided cells can be represented with a relatively simple analysis model. The analysis model for each of the divided cells is subjected to the electromagnetic field analysis. Thereafter, the interaction among the respective cells is calculated, whereby the electromagnetic field analysis of the wiring pattern 1000 as a whole can be performed. The interference amount between the wirings can be obtained from the result of the electromagnetic field analysis for the overall pattern.

However, in the case of the wiring pattern 1000 with a complicated structure as shown in FIG. 11A, the number of the divided cells increases as shown in FIG. 11B. Thus, the calculation time is increased enormously. As a result, the failure to complete the electromagnetic field analysis within a practical operation time will occur often. That is to say, in the case of a wiring board having a complicated structure, it is extremely difficult to determine the interference amount between wirings by electromagnetic field analysis practically.

Meanwhile, a method of checking noise flowing through a wiring with a low computational complexity is proposed (See JP 2000-035984A, for example). However, it is still difficult to analyze the interference between wirings in a wiring board having a complicated structure even by the method described in JP 2000-035984A.

SUMMARY OF THE INVENTION

Therefore, with the foregoing in mind, it is an object of the present invention to provide an interference analysis method, an interference analysis device, an interference analysis program and a recording medium with an interference analysis program recorded thereon, by which the interference between wirings can be analyzed at high speed, with a reduced load and in a short time period.

An interference analysis device according to the present invention analyzes interference due to electromagnetic induction between wirings of a circuit board by computer simulation, and the interference analysis device includes: a design data input part for inputting design data of the circuit board, the design data containing data representing a shape of the wirings and properties of an element or a component connected with the wirings; a noise characteristics setting part that sets, based on the design data, noise characteristics data representing electrical characteristics of virtual noise input to a terminal of at least one wiring among the wirings of the circuit board; a limit value setting part that sets, based on the design data, an allowable limit value of noise received by a terminal of at least one wiring among the wirings of the circuit board; a selection part that selects, based on the noise characteristics data and the allowable limit value, a wiring group that includes wirings to be analyzed from the wirings of the circuit board, the wiring group including a terminal to which the virtual noise is input and a terminal that receives the noise; an interference analysis part that calculates, concerning the wiring group selected by the selection part, an interference amount that represents a degree of interference from the terminal to which the virtual noise is input to the terminal that receives the noise; and a received noise level calculation part that calculates, based on the interference amount and the noise characteristics data, a noise level that the terminal that receives the noise will receive.

An interference analysis method according to the present invention is for analyzing interference due to electromagnetic induction between wirings of a circuit board by computer simulation, and the interference analysis method includes: a design data input step of inputting design data of the circuit board, the design data containing data representing a shape of the wirings and properties of an element or a component connected with the wirings; a noise characteristics setting step of setting, based on the design data, noise characteristics data representing electrical characteristics of virtual noise input to a terminal of at least one wiring among the wirings of the circuit board; a limit value setting step of setting, based on the design data, an allowable limit value of noise received by a terminal of at least one wiring among the wirings of the circuit board; a selection step of selecting, based on the noise characteristics data and the allowable limit value, a wiring group that includes wirings to be analyzed from the wirings of the circuit board, the wiring group including a terminal to which the virtual noise is input and a terminal that receives the noise; an interference analysis step of calculating, concerning the wiring group selected by the selection step, an interference amount that represents a degree of interference from the terminal to which the virtual noise is input to the terminal that receives the noise; and a received noise level calculation step of calculating, based on the interference amount and the noise characteristics data, a noise level that the terminal that receives the noise will receive.

An interference analysis program according to the present invention makes a computer execute a procedure of analyzing interference due to electromagnetic induction between wirings of a circuit board by simulation, and the procedure includes: a design data input processing of inputting design data of the circuit board, the design data containing data representing a shape of the wirings and properties of an element or a component connected with the wirings; a noise characteristics setting processing of setting, based on the design data, noise characteristics data representing electrical characteristics of virtual noise input to a terminal of at least one wiring among the wirings of the circuit board; a limit value setting processing of setting, based on the design data, an allowable limit value of noise received by a terminal of at least one wiring among the wirings of the circuit board; a selection processing of selecting, based on the noise characteristics data and the allowable limit value, a wiring group that includes wirings to be analyzed from the wirings of the circuit board, the wiring group including a terminal to which the virtual noise is input and a terminal that receives the noise; an interference analysis processing of calculating, concerning the wiring group selected at the selection processing, an interference amount that represents a degree of interference from the terminal to which the virtual noise is input to the terminal that receives the noise; and a received noise level calculation processing of calculating, based on the interference amount and the noise characteristics data, a noise level that the terminal that receives the noise will receive.

A computer readable recording medium according to the present invention records an interference analysis program that makes a computer execute a procedure of analyzing interference due to electromagnetic induction between wirings of a circuit board by simulation, and the procedure includes: a design data input processing of inputting design data of the circuit board, the design data containing data representing a shape of the wirings and properties of an element or a component connected with the wirings; a noise characteristics setting processing of setting, based on the design data, noise characteristics data representing electrical characteristics of virtual noise input to a terminal of at least one wiring among the wirings of the circuit board; a limit value setting processing of setting, based on the design data, an allowable limit value of noise received by a terminal of at least one wiring among the wirings of the circuit board; a selection processing of selecting, based on the noise characteristics data and the allowable limit value, a wiring group that includes wirings to be analyzed from the wirings of the circuit board, the wiring group including a terminal to which the virtual noise is input and a terminal that receives the noise; an interference analysis processing of calculating, concerning the wiring group selected at the selection processing, an interference amount that represents a degree of interference from the terminal to which the virtual noise is input to the terminal that receives the noise; and a received noise level calculation processing of calculating, based on the interference amount and the noise characteristics data, a noise level that the terminal that receives the noise will receive.

According to the interference analysis method, the interference analysis device, the interference analysis program and the recording medium with an interference analysis program recorded thereon of the present invention, the interference between wirings can be analyzed at high speed, with a reduced load and for a short time period.

BRIEF DESCRIPTION OF THE DRAWINGS

FIG. 7 shows an example of a wiring group that becomes a target of the interference analysis.

DETAILED DESCRIPTION OF THE INVENTION

Figure 1:
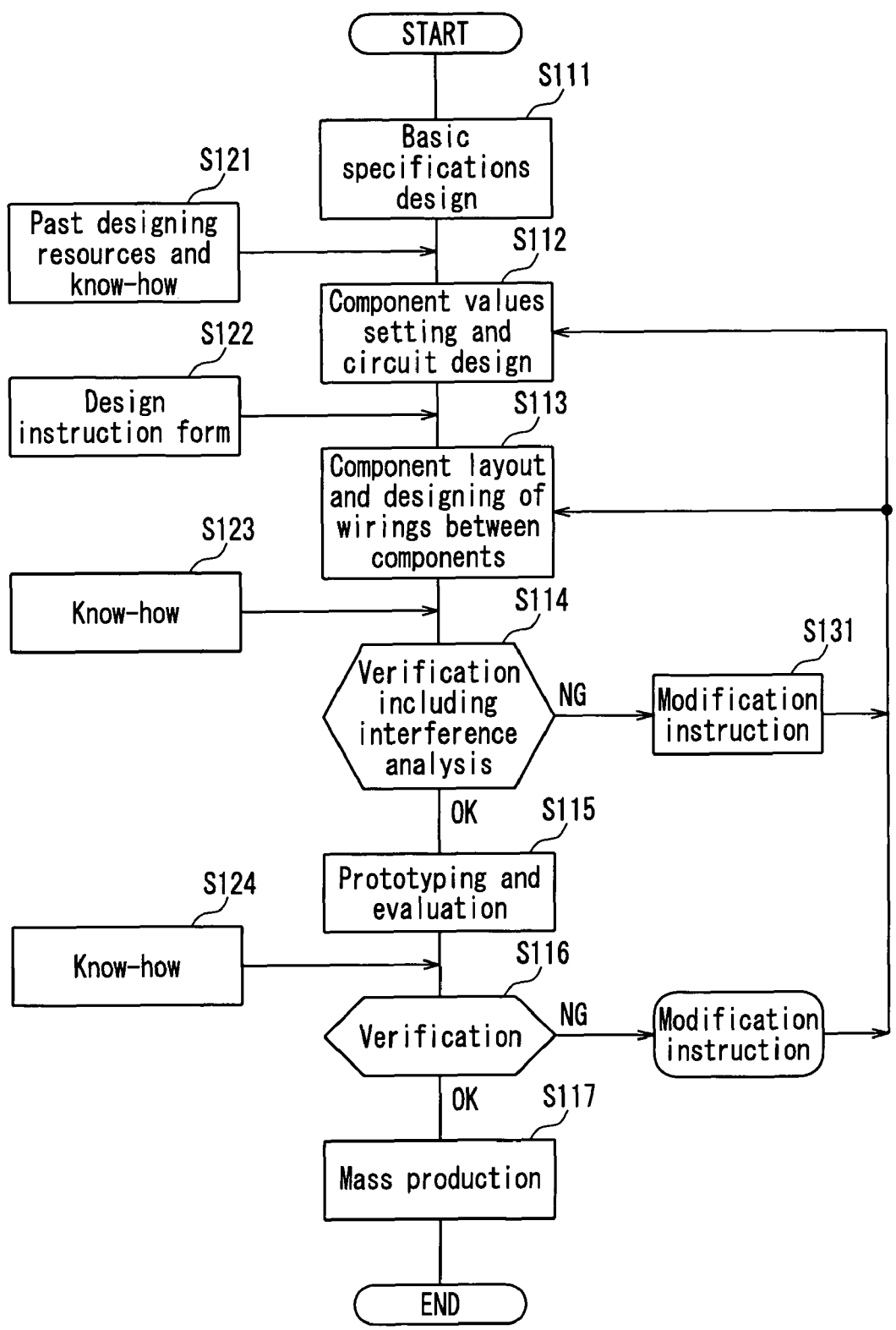
FIG. 1 is a flowchart showing the outline procedure of high-frequency circuit design according to Embodiment 1 of the present invention.

The interference analysis device according to the present invention analyzes interference due to electromagnetic induction between wirings of a circuit board by computer simulation, and the interference analysis device includes: a design data input part for inputting design data of the circuit board, the design data containing data representing a shape of the wirings and properties of an element or a component connected with the wirings; a noise characteristics setting part that sets, based on the design data, noise characteristics data representing electrical characteristics of virtual noise input to a terminal of at least one wiring among the wirings of the circuit board; a limit value setting part that sets, based on the design data, an allowable limit value of noise received by a terminal of at least one wiring among the wirings of the circuit board; a selection part that selects, based on the noise characteristics data and the allowable limit value, a wiring group that includes wirings to be analyzed from the wirings of the circuit board, the wiring group including a terminal to which the virtual noise is input and a terminal that receives the noise; an interference analysis part that calculates, concerning the wiring group selected by the selection part, an interference amount that represents a degree of interference from the terminal to which the virtual noise is input to the terminal that receives the noise; and a received noise level calculation part that calculates, based on the interference amount and the noise characteristics data, a noise level that the terminal that receives the noise will receive.

In the interference analysis device according to the present invention, the noise characteristics setting part and the limit value setting part set, based on the design data of the circuit board, the noise characteristics data and the allowable limit value of noise, respectively, for specific terminals of the wirings of the circuit board. The selection part selects, based on the thus set noise characteristics data and the allowable limit value of noise, a wiring group that needs to undergo the interference analysis. The interference analysis part and the received noise level calculation part perform the calculation only for the selected wiring group, i.e., the wiring group needing to undergo the interference analysis. Therefore, the interference can be analyzed for a short timed period. That is, only the minimum wirings required need be extracted, and the interference amount therefor calculated, so that the calculation of the interference amount can be reduced considerably. As a result, the interference between wirings can be analyzed at a high speed, with reduced load and in a short time period. This, in turn, leads to the calculation of the interference amount in a short time period even in a circuit having complicated wirings and structure.

It is preferable that the interference analysis device of the present invention further include a decision part that decides as to whether the interference occurring in the wiring group selected by the selection part poses a problem or not by comparing the noise level calculated by the received noise level calculation part and the allowable limit value.

Since the decision part decides as to whether the interference occurring in the wiring group selected by the selection part poses a problem or not, the wiring group whose interference would have an adverse effect can be clarified in the designed circuit. As a result, it can be decided as to whether the influence of the interference poses a problem or not in the designed wirings. That is, it can be decided as to whether the designed wirings fail to function normally by the influence of the interference or not or as to whether, even were the wirings to be affected by the interference, such influence is within a range that is acceptable for a normal operation or not. This, in turn, leads to considerable reduction in the designing load for a high frequency circuit.

In the interference analysis device of the present invention, preferably, the noise characteristics data represents a strength of the virtual noise that is provided for each of a plurality of different frequencies, and the interference analysis part calculates the interference amount for each of the plurality of different frequencies.

The noise characteristics data represents a strength of the virtual noise that is provided for each of a plurality of different frequencies, and therefore a change of the virtual noise strength in accordance with the frequency can be represented. Further, since the interference analysis part calculates the interference amount for each of the plurality of different frequencies, a change of the interference amount in accordance with the frequency can be calculated. Thus, the received noise level calculation part can calculate, based on the noise characteristics data and the interference amounts for the plurality of different frequencies, the received noise levels at the different frequencies. As a result, a change of the received noise level in accordance with the frequency can be obtained.

In the interference analysis device of the present invention, preferably, the allowable limit value is provided for each of a plurality of different frequencies.

Since the allowable limit values are provided for a plurality of different frequencies, the allowable limit values can be set so as to change in accordance with the frequency.

In the interference analysis device of the present invention, preferably, the interference analysis part calculates the interference amount by using data representing properties of a component disposed partway in at least one wiring of the wirings included in the wiring group to be analyzed.

The interference analysis device uses the data representing properties of a component disposed partway in a wiring for the calculation of the interference amount, whereby an interference amount closer to the actual one can be obtained, which includes the influence of, e.g., resonance by the component disposed partway in the wiring.

In the interference analysis device of the present invention, preferably, the data representing properties of a component disposed partway in at least one wiring of the wirings included in the wiring group to be analyzed represents an impedance or a S parameter that is provided for each of a plurality of different frequencies.

Since the properties of the component are represented with impedances at the plurality of different frequencies, the frequency characteristics of the component can be represented. Therefore, the interference analysis part can calculate the interference amount that reflects the frequency characteristics of the component.

In the interference analysis device of the present invention, preferably, the interference analysis part calculates the interference amount by using data representing a terminal condition of an element or a component connected with at least one of terminals of the wirings included in the wiring group to be analyzed.

Since the interference analysis part calculates the interference amount by using data representing a terminal condition of a component or an element, an interference amount closer to the actual one can be obtained, which includes the influence of the terminal condition of the component or the element connected with the terminal of the wiring.

In the interference analysis device of the present invention, preferably, the terminal condition is represented with impedances or S parameters for a plurality of different frequencies.

Since the terminal condition is represented with impedances or S parameters for a plurality of different frequencies, the frequency characteristics of the terminal condition can be represented. Therefore, the interference analysis part can calculate the interference amount that reflects the frequency characteristics of the terminal condition of the component.

In the interference analysis device of the present invention, preferably, in the case where the wiring group selected by the selection part includes a plurality of terminals of wirings giving the interference, the interference analysis part calculates, concerning each of the terminals of the wirings giving the interference, an amount of interference that is given to the terminal of the wiring receiving the interference, and the received noise level calculation part calculates the received noise level by synthesizing received noise levels that the terminal of the wiring receiving the interference receives from the respective plurality of terminals of the wirings giving the interference. Thus, the received noise level calculation part can calculate a noise level in which the noise levels received from the plurality of terminals of the wirings are synthesized.

In the interference analysis device of the present invention, preferably, when the received noise level calculation part synthesizes the plurality of received noise levels, the synthesis is performed with consideration given to a phase of the noise.

In this way, since the plurality of received noise levels are synthesized with consideration given to a phase of the noise, a received noise level closer to the actual one can be calculated.

In the interference analysis device of the present invention, the wirings to be analyzed concerning the interference may be wirings of a printed circuit board or wirings in a LSI.

The interference analysis method according to the present invention is for analyzing interference due to electromagnetic induction between wirings of a circuit board by computer simulation. The interference analysis method includes: a design data input step of inputting design data of the circuit board, the design data containing data representing a shape of the wirings and properties of an element or a component connected with the wirings; a noise characteristics setting step of setting, based on the design data, noise characteristics data representing electrical characteristics of virtual noise input to a terminal of at least one wiring among the wirings of the circuit board; a limit value setting step of setting, based on the design data, an allowable limit value of noise received by a terminal of at least one wiring among the wirings of the circuit board; a selection step of selecting, based on the noise characteristics data and the allowable limit value, a wiring group that includes wirings to be analyzed from the wirings of the circuit board, the wiring group including a terminal to which the virtual noise is input and a terminal that receives the noise; an interference analysis step of calculating, concerning the wiring group selected by the selection step, an interference amount that represents a degree of interference from the terminal to which the virtual noise is input to the terminal that receives the noise; and a received noise level calculation step of calculating, based on the interference amount and the noise characteristics data, a noise level that the terminal that receives the noise will receive.

Preferably, the interference analysis method of the present invention further includes a decision step of deciding as to whether the interference occurring in the wiring group selected at the selection step poses a problem or not by comparing the noise level calculated at the received noise level calculation step and the allowable limit.

The interference analysis program according to the present invention makes a computer execute a procedure of analyzing interference due to electromagnetic induction between wirings of a circuit board by simulation, and the procedure includes: a design data input processing of inputting design data of the circuit board, the design data containing data representing a shape of the wirings and properties of an element or a component connected with the wirings; a noise characteristics setting processing of setting, based on the design data, noise characteristics data representing electrical characteristics of virtual noise input to a terminal of at least one wiring among the wirings of the circuit board; a limit value setting processing of setting, based on the design data, an allowable limit value of noise received by a terminal of at least one wiring among the wirings of the circuit board; a selection processing of selecting, based on the noise characteristics data and the allowable limit value, a wiring group that includes wirings to be analyzed from the wirings of the circuit board, the wiring group including a terminal to which the virtual noise is input and a terminal that receives the noise; an interference analysis processing of calculating, concerning the wiring group selected at the selection processing, an interference amount that represents a degree of interference from the terminal to which the virtual noise is input to the terminal that receives the noise; and a received noise level calculation processing of calculating, based on the interference amount and the noise characteristics data, a noise level that the terminal that receives the noise will receive.

Preferably, the interference analysis program of the present invention makes a computer further execute a decision processing of deciding as to whether the interference occurring in the wiring group selected at the selection processing poses a problem or not by comparing the noise level calculated at the received noise level calculation processing and the allowable limit value.

The computer readable recording medium according to the present invention records an interference analysis program that makes a computer execute a procedure of analyzing interference due to electromagnetic induction between wirings of a circuit board by simulation. The procedure includes: a design data input processing of inputting design data of the circuit board, the design data containing data representing a shape of the wirings and properties of an element or a component connected with the wirings; a noise characteristics setting processing of setting, based on the design data, noise characteristics data representing electrical characteristics of virtual noise input to a terminal of at least one wiring among the wirings of the circuit board; a limit value setting processing of setting, based on the design data, an allowable limit value of noise received by a terminal of at least one wiring among the wirings of the circuit board; a selection processing of selecting, based on the noise characteristics data and the allowable limit value, a wiring group that includes wirings to be analyzed from the wirings of the circuit board, the wiring group including a terminal to which the virtual noise is input and a terminal that receives the noise; an interference analysis processing of calculating, concerning the wiring group selected at the selection processing, an interference amount that represents a degree of interference from the terminal to which the virtual noise is input to the terminal that receives the noise; and a received noise level calculation processing of calculating, based on the interference amount and the noise characteristics data, a noise level that the terminal that receives the noise will receive.

Preferably, in the recording medium with an interference analysis program recorded thereon according to the present invention, the interference analysis program makes a computer further execute a decision processing of deciding as to whether the interference occurring in the wiring group selected at the selection processing poses a problem or not by comparing the noise level calculated at the received noise level calculation processing and the allowable limit value.

The following describes one embodiment of the present invention, with reference to the drawings. It should be noted that the present invention is not limited to the following embodiment.

Embodiment 1

Embodiment 1 relates to an interference analysis method and an interference analysis device for alleviating a designing load of a high frequency circuit, and also relates to a program that makes a computer execute the procedure for embodying the interference analysis method and the interference analysis device and a recording medium with this program recorded thereon.

FIG. 1 is a flowchart showing the outline procedure of high-frequency circuit design, which is performed using the interference analysis method according to the present embodiment.

The outline procedure shown in FIG. 1 is similar to the outline procedure of the conventional digital circuit design shown in FIG. 9 in many respects, and therefore such similar respects will be described briefly and different points will be described in detail.

According to this design process, firstly, basic specifications are designed (S111). The design of the basic specifications does not involve the specific configurations of the circuit and elements and the layout of the elements. Rather, specifications required for the circuit to be designed and basic requirements for implementing the required specifications are selected and determined. This is similar to the outline procedure of the digital circuit design shown in FIG. 9.

Subsequent to the design of the basic specifications (S111), component values are set and the specific circuit configuration is designed for implementing the basic specifications (S112).

At this stage, designing resources and know-how of the past stored in the design and development department are exploited (S121). This also is similar to the outline procedure of the digital circuit design shown in FIG. 9.

Subsequent to the setting of the specific component values and the design of the specific circuit configuration based on the basic specifications (S112), the layout of components and the wirings between the components are designed (S113).

At this time, in many cases, a design instruction form (S122) is used for the specific layout of the components and the design of the wirings between the components, where matters to be noted and to be followed are described in the design instruction form.

The design instruction form (S122) is used for allowing different groups and persons to share the knowledge so as to ensure the suitability and the accuracy of the design. This also is similar to the outline procedure of the digital circuit design shown in FIG. 9.

After the layout of the components and the design of the wirings between components (S113) have been finished, then the verification thereof is performed (S114).

A large amount of know-how (S123) is exploited also for this verification. This also is similar to the outline procedure of the digital circuit design shown in FIG. 9.

Figure 9:
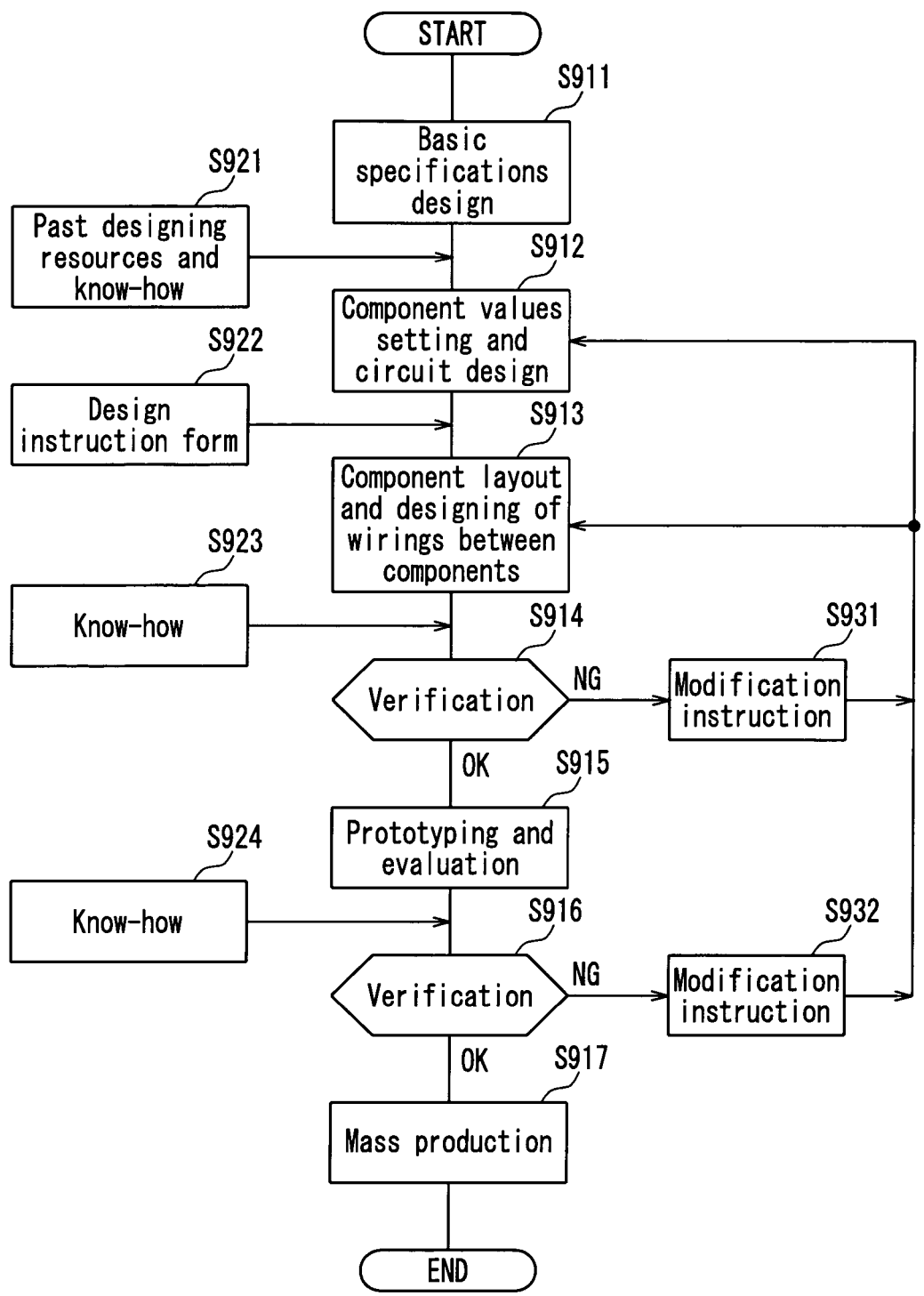
FIG. 9 is a flowchart showing the outline procedure of conventional digital circuit design.
Figure 10:
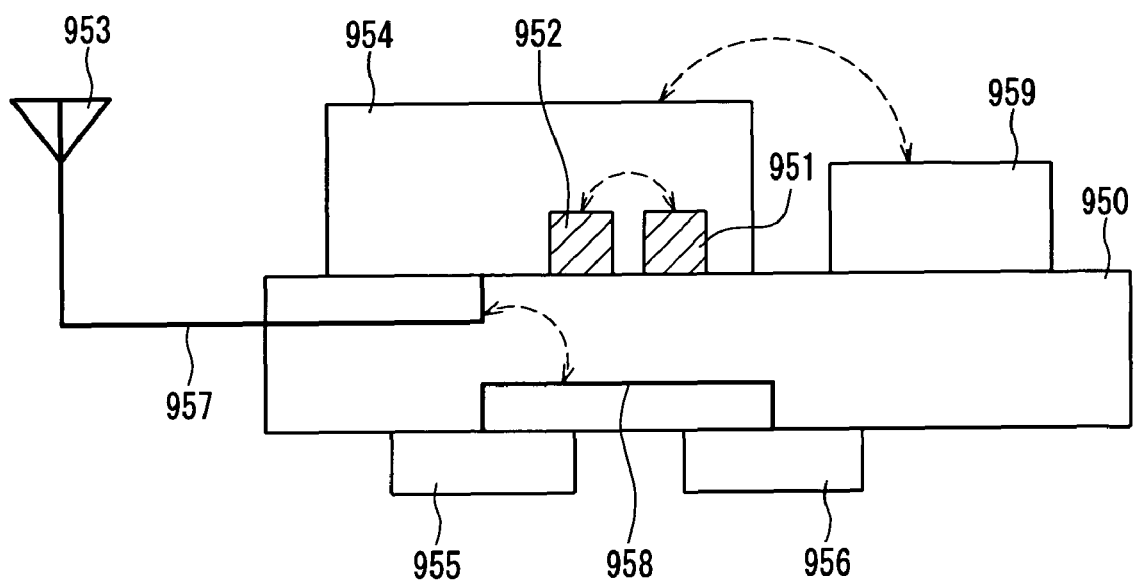
FIG. 10 schematically shows an example of a portion of a high frequency electronic circuit, in which the interference may occur.

However, the most distinctive part of the outline procedure of the high-frequency circuit design according to the present embodiment compared with the outline procedure of the conventional digital circuit design shown in FIG. 9 is this verification procedure (S114).

In this verification (S114), interference between wirings in the designed circuit is analyzed. An interference analysis device according to the present embodiment is used for this interference analysis.

Since this verification (S114) will be described later in detail, the above simple description only is given here.

If nonconforming parts are found by this verification (S114) (in the case of NG in S114), a modification instruction form is created (S131) and the setting of component values and the circuit design (S112) or the layout of components and the design of the wirings between components (S113) are performed again.

The modification instruction form (S131) is a document containing: information on the parts decided as nonconforming by the verification (S114); the data indicating the reason for the decision; matters to be noted for the modification; and other various information. That is to say, the modification instruction form (S131) is rich in information useful for conducting again the setting of component values and the circuit design (S112) and the layout of components and the design of the wirings between components (S113) more appropriately and accurately. This also is similar to the outline procedure of the digital circuit design shown in FIG. 9.

Based on this modification instruction form (S131) and depending on the types of the nonconformance found by the verification (S114), a determination is made as to whether the procedure should return to the step of the setting of component values and the circuit design (S112) or the step of the layout of components and the design of the wirings between components (S113). This also is similar to the outline procedure of the digital circuit design shown in FIG. 9.

If nonconforming parts are not found by the verification (S114) (in the case of OK in S114), then a prototype is manufactured and is evaluated (S115)

While the verification (S114) is performed mainly by simulation using a computer, the verification at the step of the prototyping and its evaluation (S115) or later is conducted using an actually manufactured circuit. This also is similar to the outline procedure of the digital circuit design shown in FIG. 9.

After the prototyping and its rough theoretical evaluation (S115) have been finished, then the prototype is activated actually so as to carry out the verification (S116). This also is similar to the outline procedure of the digital circuit design shown in FIG. 9.

According to the present embodiment, nonconforming parts are found very rarely in this verification (S116) (NG is rare in S116). That is to say, the second different point of the outline procedure of the high frequency circuit design according to the present embodiment from the outline procedure shown in FIG. 9 resides in that nonconforming parts rarely are found in this verification (S116).

This is because the detailed verification is performed with the procedure described later in the verification (S114) after the layout of the components and the design of the wirings between components (S113), and therefore further nonconforming parts are found rarely in the verification (S116) after the prototyping and its evaluation (S115).

This will be described later in more detail.

For this reason, nonconforming parts hardly are found in the verification (S116) (OK in most cases in S116). Therefore, after the prototyping and its evaluation, the procedure hardly returns to the steps of the setting of component values and the circuit design (S112) or the layout of components and the design of the wirings between components (S113).

As a result, following the prototyping and its evaluation (S115) performed only once, the procedure can go to a mass production stage (S117). Thus, the design procedure of the high frequency circuit according to the present embodiment is completed.

Figure 2:
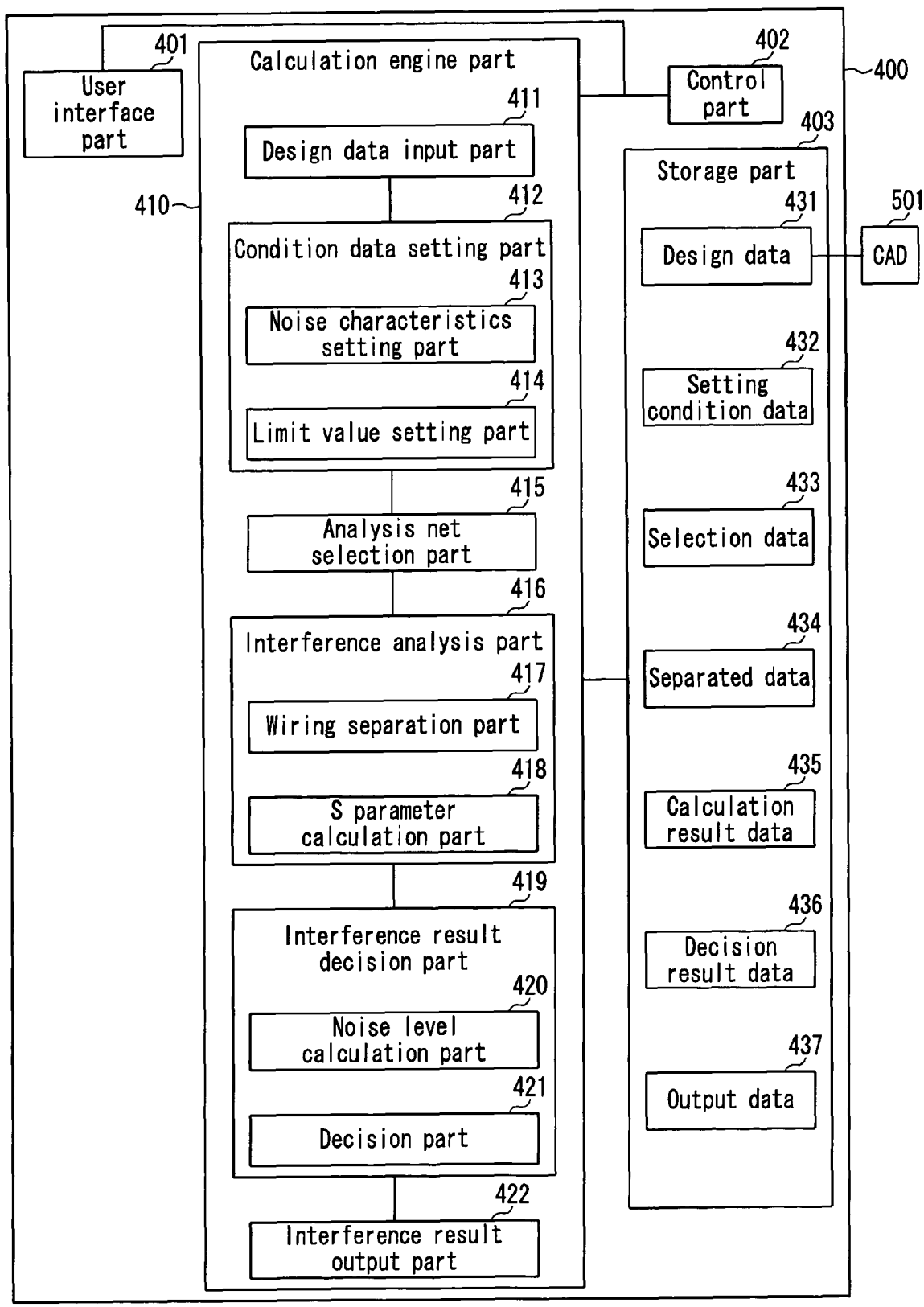
FIG. 2 is a functional block diagram showing one example of the structure of an interference analysis device.

The following describes the interference analysis device that performs the verification (114) after the layout of components and the design of the wirings between components (S113). FIG. 2 is a functional block diagram showing an exemplary structure of the interference analysis device according to the present embodiment.

The interference analysis device 400 according to the present embodiment mainly includes: a user interface part 401; a control part 402; a storage part 403; and a calculation engine part 410.

The user interface part 401 allows a user of the interference analysis device 400 to perform operations for using this interference analysis device 400 and to input various commands and data. The user interface part 401 also outputs a processing result. For instance, the user interface part 401 outputs the result of the processing by the calculation engine part 410.

The control part 402 controls the interference analysis device 400 as a whole, and controls various below-described processes generally. The data and programs required for such control are stored in the storage part 403.

The interference analysis device 400 can be configured with a computer such as a personal computer and a workstation. The functions of the control part 402 and the calculation engine part 410 can be embodied by executing predetermined programs by a CPU of a computer.

The computer further may include: general-purpose computers such as microcomputers, personal computers, workstations, mainframe computers, supercomputers and minicomputers, as well as computers configured with various gate arrays (GA), programmable GAs, microcomputer cores of these and wired-logics.

For the storage part 403, recording media that record information by a magnetic or an optical method may be used, including various semiconductor memories, various RAMs, various ROMs, hard disks (HD) and DVDs. The storage part 403 may be configured with a single device or with a combination of a plurality of devices. The storage part 403 stores, for example, data used for various general processes by the interference analysis device 400, their processing results or in-progress data and programs for controlling the various general processes.

The calculation engine part 410 mainly includes: a design data input part 411, a condition data setting part 412, an analysis net selection part 415, an interference analysis part 416, an interference result decision part 419 and an interference result output part 422. The condition data setting part 412 includes a noise characteristics setting part 413 and a limit value setting part 414. The interference analysis part 416 includes a wiring separation part 417 and a S parameter calculation part 418. The interference result decision part 419 includes a noise level calculation part 420 and a decision part 421.

The design data input part 411 enables the input of design data 431 of a circuit board. Herein, the input of design data allows the calculation engine part 410 to access the design data 431. For instance, the design data input part 411 reads the design data 431 of a circuit board prepared with a CAD 501 from the CAD 501 and stores the same in the storage part 403.

Herein, it is not necessarily required to store the design data 431 in the storage part 403. For instance, the calculation engine part 410 may access a recording device on a CAD system connected with the interference analysis device 400 via a network.

The condition data setting part 412 generates, based on the design data 431, various parameters for setting below-described virtual noise characteristics and a noise allowable limit value, and stores the same in the storage part 403 as setting condition data 432.

The analysis net selection part 415 selects, based on the setting condition data 432 and the design data 431, a net becoming a target of the analysis, and stores information representing the selected net in the storage part 403 as selection data 433.

The wiring separation part 417 separates, based on separation parameters stored beforehand (not illustrated) and the selection data 433, the wirings targeted for the analysis into a plurality of segments. The details of this processing will be described later. The separated data is stored in the storage part 403 as separated data 434. The above-mentioned separation parameters are various parameters for performing the segment separation.

The S parameter calculation part 418 mainly conducts S-matrix calculation based on the design data 431, the setting condition data 432, the selection data 433, the separated data 434 and the like. The details of the processing will be described later.

The result of the S-matrix calculation is stored in the storage part 403 as calculation result data 435.

The noise level calculation part 420 calculates a received noise level based on the setting condition data 432 and the calculation result data 435. The decision part 421 decides the influence of the interference based on the received noise level and the setting condition data 432. The details of the processing will be described later.

The results of the calculation of the received noise level and the decision also are stored in the storage part 403 as decision result data 436.

The interference result output part 422 processes the decision result data 436 stored in the storage part 403 so as to make it understandable to a user, and outputs the same through the user interface part 401.

The data output from the interference result output part 422 also is stored in the storage part 403 as output data 437.

Figure 3:
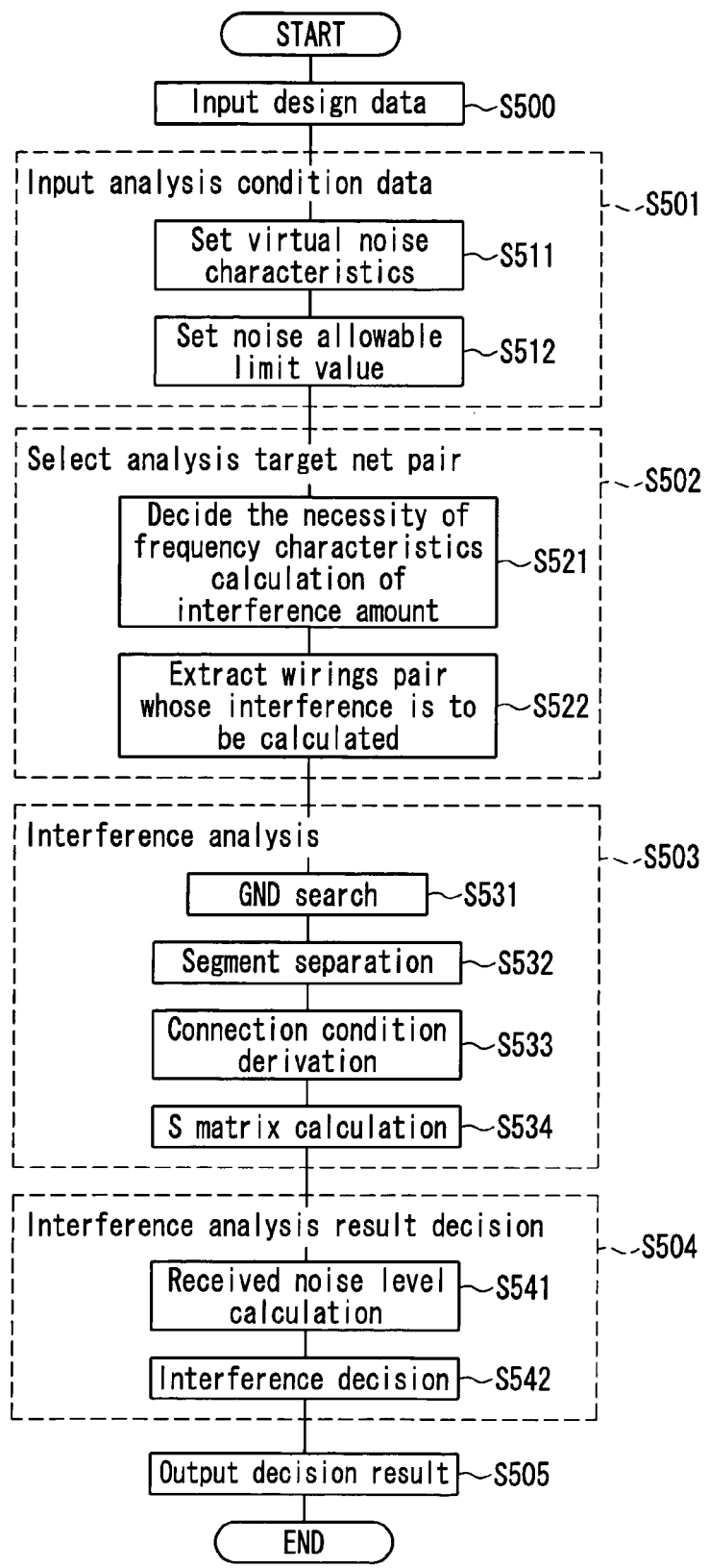
FIG. 3 shows the outline flow of the interference analysis process performed by an interference analysis device 400.

Referring now to FIGS. 2 and 3, the procedure of the process performed by the interference analysis device 400 during the verification (S114) after the layout of components and the design of the wirings between components (S113) (See FIG. 1) will be described below.

FIG. 3 shows the outline flow of the interference analysis process performed by the interference analysis device 400. Firstly, design data 431 is input through the design data input part 411 (S500). The design data input part 411 reads the design data prepared with the CAD 501, for example, into the storage part 403 so as to allow the calculation engine part 410 to access the design data. The design data 431 contains, for example, data representing: the layout of components, elements and their terminals; the shape of the wiring pattern connecting the components and the elements; the shapes of the components, the elements and their terminals; properties or product numbers of the components, the elements and their terminals; and materials of a board and the wirings.

Next, the condition data setting part 412 performs the setting of analysis condition data (S501). The condition data setting part 412 specifies a part of or an entire circuit board that is represented by the design data 431 as a region becoming a target of the analysis. In the case where the circuit board is configured with a plurality of layers, all of the layers constituting the circuit board may be specified as the target of the analysis or a part of the layers may be specified as the target of the analysis.

Figure 4:
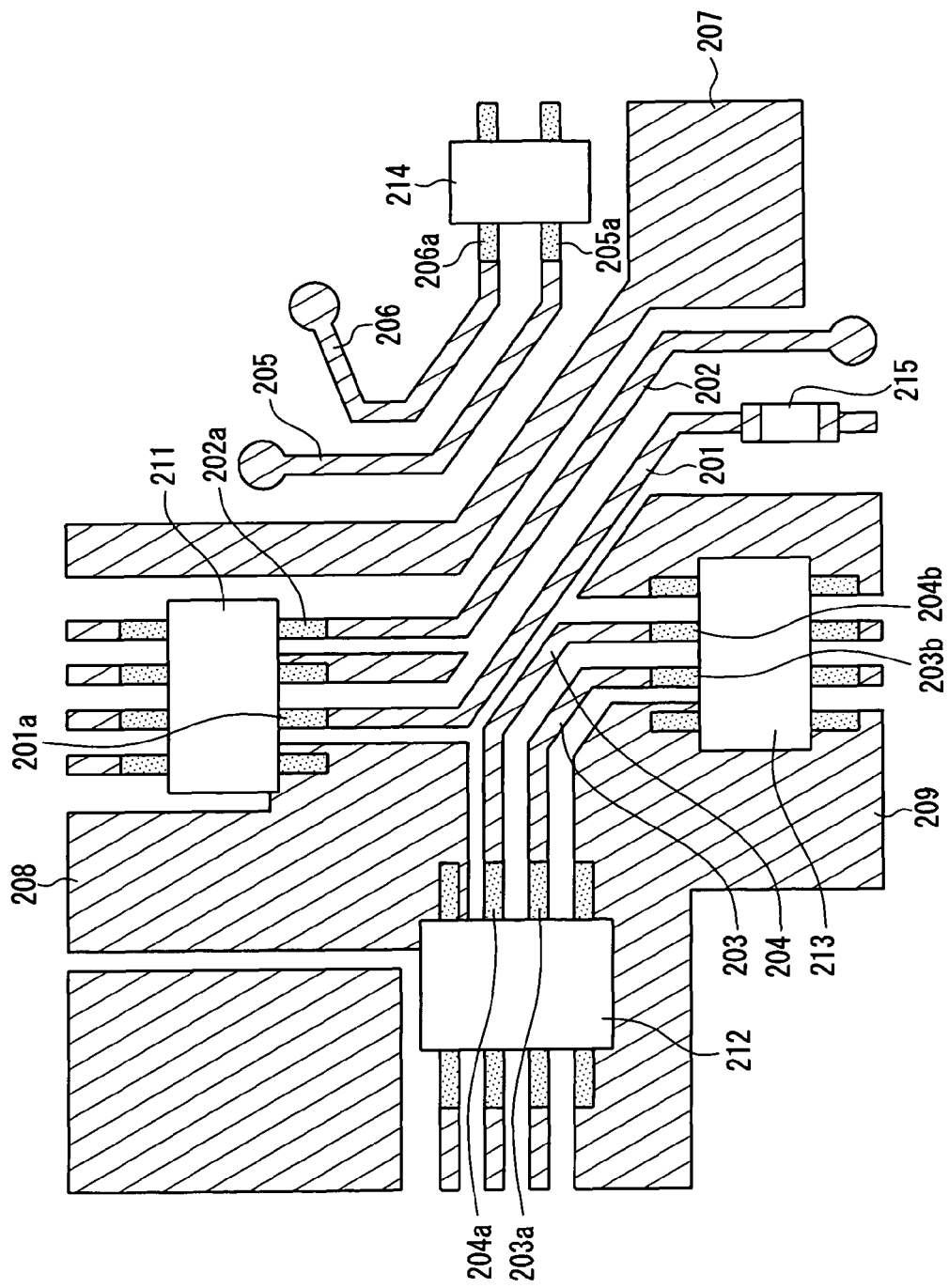
FIG. 4 schematically shows an exemplary wiring pattern in one layer included in the region becoming the target of the analysis.

FIG. 4 schematically shows an exemplary wiring pattern in one layer included in the region becoming the target of the analysis. The wiring pattern shown in FIG. 4 is represented by the design data 431.

With respect to the region becoming the target of the analysis, the noise characteristics setting part 413 performs the setting of characteristics of virtual noise (S511) and the limit value setting part 414 performs the setting of a noise allowable limit value (S512).

The characteristics of the virtual noise are set as follows (S511): with respect to a wiring having the possibility of interfering with other wirings while considering the computer simulation of the interference analysis, the noise characteristics setting part 413 sets electrical characteristics of virtual noise that may be input to a terminal of the wiring.

Noise normally arises from active components connected with a terminal of a wiring, for example, and is input to the terminal of the wiring. At this time, the electrical characteristics of the noise arising from the terminal of the component as a noise generation source often are included in the design data 431. That is, the electrical characteristics of virtual noise that is expected to arise from a terminal of a component or of an element are included often as data representing the properties of the component or the element in the design data 431. For instance, for a terminal of an active component packaged on a board or a terminal connected with an antenna, electrical characteristics of virtual noise are set beforehand at the design stage.

Data representing the electrical characteristics of virtual noise for a component contains, for example, a noise source model and information relating to a terminal producing noise. The noise source model contains, for example, data representing a change in the noise strength in accordance with the frequency. The information relating to a terminal producing noise contains, for example, a flag indicating whether the terminal produces noise or not and an impedance of the terminal.

Figure 5A:
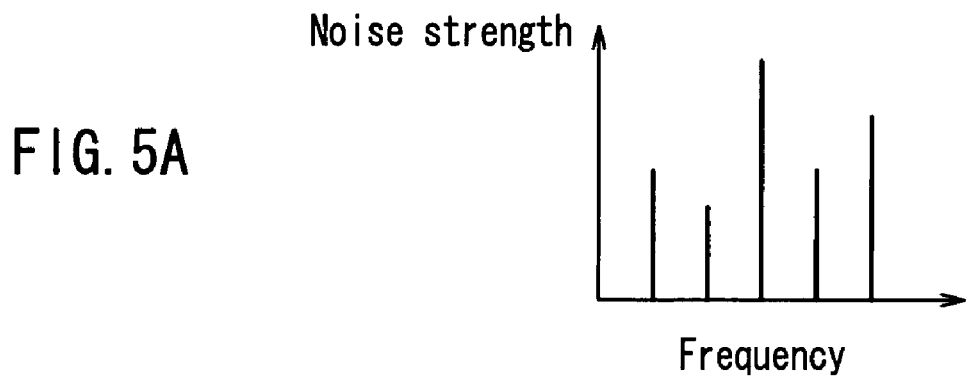
FIG. 5A shows an exemplary noise source model.

FIG. 5A shows an exemplary noise source model. The noise source model is represented by noise strengths at a plurality of different frequencies. Normally, a noise strength changes in accordance with a frequency of the noise. Therefore, the frequency characteristics of the noise strength can be used as a noise source model.

Herein, instead of the frequency characteristics for the noise strength only, the frequency characteristics for the noise strength and the noise phase can be used as the noise source model. For instance, in the case where a plurality of terminals, for which noise source models are to be set, are present, a difference in phase between the respective noises may be set, thus further enhancing the analysis accuracy.

The noise source model shown in FIG. 5A merely is an example, and the number of frequencies, the width, its strength level and the number of the stages may be set variously.

Based on the data representing the electrical characteristics of virtual noise for components included in the design data 431, the noise characteristics setting part 413 sets the electrical characteristics of virtual noise that may be input to wirings connected with terminals of the components.

For instance, in the wiring pattern shown in FIG. 4, components 211, 212, 213, 214 and 215, wirings 201, 202, 203, 204, 205 and 206 connected with the respective components and ground patterns 207, 208 and 209 are present.

In the case where the component 211 is an active component and data representing electrical characteristics of virtual noise is set for terminals 201*a* and 202*a* of the component 211 in the design data 431, then the noise characteristics setting part 413 automatically can select the terminal 201*a* and the terminal 202*a*, and can set the characteristics data of virtual noise, which are set for these terminals, as data representing the electrical characteristics of the virtual noise that will be input to the wirings 201 and 202.

Alternatively, in the case where the data representing the electrical characteristics of the virtual noise of the component 211 is not included in the design data 431, a designer is allowed to input data representing the electrical characteristics of the virtual noise via the user interface part 401.

Furthermore, in the case where there is no input from a designer of the data representing a noise source model, a constant value (a default value), which is set beforehand, can be set as the data representing the electrical characteristics of virtual noise.

Similar to the wirings 201 and 202, noise source models are set also for the wirings 203 and 204. The wirings for which noise source models are to be set have the possibility of interfering with other wirings. The wirings having the possibility of interfering with other wirings include, for example, a wiring connected with a component becoming a noise generation source such as an active component.

For the wiring 203, with respect to two terminals of a terminal 203*a* connected with the component 212 and a terminal 203*b* connected with the component 213, the characteristics of noises that will be input to the respective terminals are set. A designer may select for which terminal the characteristics of noise should be set through the user interface part 401, or as stated above the noise characteristics setting part 413 may select automatically a terminal for which virtual noise has been set in the component data contained in the design data 431.

In this way, the electrical characteristics of virtual noise that are set for a terminal of a wiring may be unique for each wiring. Alternatively, common electrical characteristics of virtual noise may be set for all of the wirings. Common electrical characteristics of virtual noise may be set for plural wirings that are a part of the wirings present in the analyzed region.

Herein, terminals 205*a* and 206*a* of the wirings 205 and 206 are not selected as terminals to be analyzed. Further, in the present embodiment, terminals of the ground patterns 207, 208 and 209 also are not selected as terminals to be analyzed.

Note here that the electrical characteristics of virtual noise may be set for the terminals of the ground patterns 207, 208 and 209. By treating the ground patterns and patterns for power supply similarly to the wirings, the interference analysis can be performed for common mode noise.

The noise characteristics setting part 413 lets the storage part 403 store the thus set data representing the electrical characteristics of virtual noise so as to be included in the setting condition data 432.

Next, with respect to a terminal of at least one wiring among the wirings of the circuit board, the limit value setting part 414 sets an allowable limit value of noise received by the terminal (S512).

The allowable limit value of noise is set for a terminal of a wiring that will receive the interference while considering computer simulation of the interference analysis, and this value represents the noise strength that is allowable even when noise due to the interference reaches the terminal. That is, if a terminal of a wiring receives noise larger than the allowable limit value set for the terminal, the circuit including the wiring cannot operate normally.

The allowable limit value of noise is contained often as data representing the properties of components in the design data 431. Normally, in the design data 431, allowable limit values of noise are set beforehand for terminals of active components packaged in the board and, in some cases, for terminals of passive components.

The limit value setting part 414 selects automatically the terminals of the wirings connected with the components for which the allowable limit values of noise have been set in the design data 431, and sets allowable limit values of noise for the terminals of the wirings.

For instance, in the example shown in FIG. 4, in the case where the allowable limit values of noise have been set for the terminals 203*b* and 204*b* of the component 213 in the design data 431, then allowable limit values of noise are set for the terminals 203*b* and 204*b* of the wirings.

Further, a designer may select a terminal of a wiring for which the allowable limit value of noise should be set through the user interface part. Further, the designer may input the allowable limit value of noise.

Note here that the allowable limit value may be set with respect to the wiring for which the noise characteristics setting part 413 sets the electrical characteristics of virtual noise. For instance, the electrical characteristics of virtual noise may be set for one terminal of one wiring, while setting the noise allowable limit value for the other terminal. Such setting allows the influence of noise passing through one wiring to be analyzed.

Further, the allowable limit value may be set with respect to the terminal for which the electrical characteristics of virtual noise have been set. Such setting enables the analysis of the influence of noise when the noise input to the terminal is reflected and returns to the same terminal.

Figure 5B:
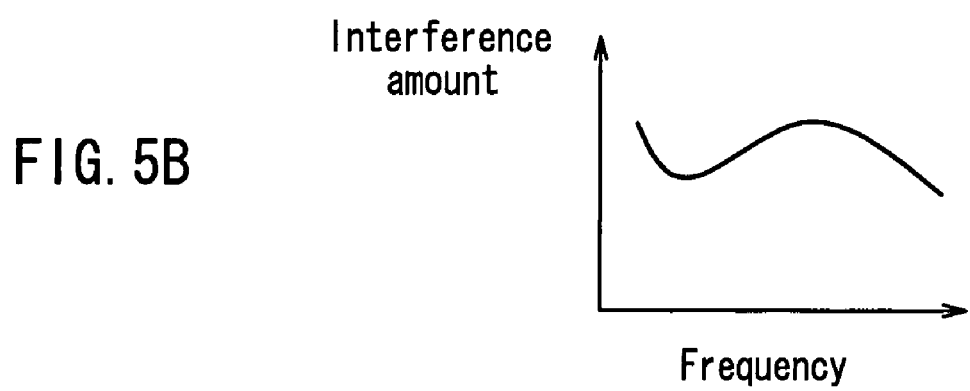
FIG. 5B shows exemplary interference characteristics obtained from a wiring pattern and FIG. 5C shows exemplary noise allowable limit values and one example of the received noise level calculated by a noise level calculation part.
Figure 5C:
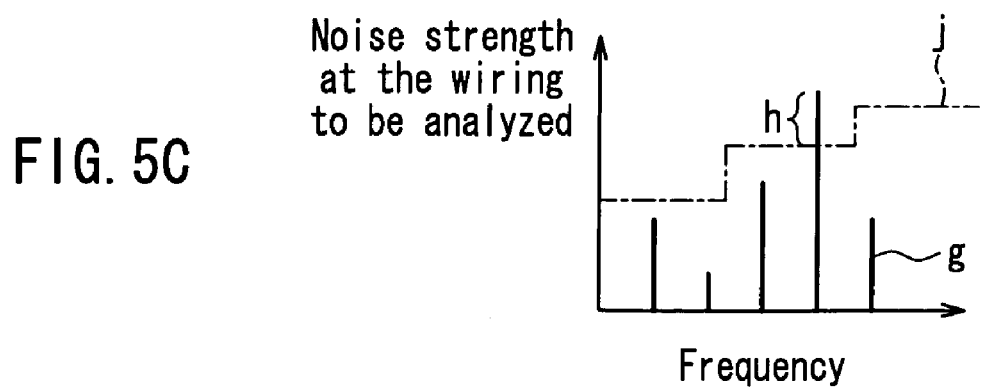

FIG. 5C shows exemplary noise allowable limit values. In FIG. 5C, the alternate long and short dash line j indicates the allowable noise level, i.e., the noise allowable limit value. The noise allowable limit value is varied in accordance with the frequency of the noise. Therefore, the noise allowable limit value is provided for each of a plurality of different frequencies. The noise allowable limit value shown in FIG. 5C merely is an example, and the number of frequencies, the width, its strength level and the number of the stages may be set variously. Although the allowable noise level is indicated with a continuous alternate long and short dash line j in FIG. 5C, the noise allowable limit value is set as discontinuous values so that the noise allowable limit value can be set for each specific frequency segment.

The thus set noise allowable limit value also may be unique for each wiring. Alternatively, a common noise allowable limit value may be set for all of the wirings. A common noise allowable limit value may be set for plural wirings that are a part of the wirings present in the analyzed region.

The limit value setting part 414 lets the storage part 403 store the thus set noise allowable limit value so as to be included in the setting condition data 432.

In the above description, the electrical characteristics of virtual noise and the noise allowable limit values are set for terminals of wirings. In a circuit board, both ends of a wiring are connected always with components or elements, and therefore the terminals of the wirings are the terminals of the components or the elements.

For instance, by setting the electrical characteristics of virtual noise for the signal input/output terminals of active elements such as IC and amplifiers and terminals of components such as power supply terminals, the noise source specific to the components can be set. Especially, the electrical characteristics of virtual noise are set often for an output terminal of a power amplifier, an output driver terminal of IC and the like.

Further, the electrical characteristics of virtual noise can be set for a filter, a switch, a connector and the like. By setting the electrical characteristics of virtual noise for a connector connecting boards, the interference analysis can be performed with consideration given to the influence of noise flowing through the boards.

Similarly to the electrical characteristics of virtual noise, the allowable limit values of noise also are set for terminals of wirings, i.e., terminals of components. Therefore, the values specific to the components can be set. In a board on which a plurality of the same type of components are packaged thereon, the same value can be set for the same type of components, thus enhancing versatility.

The allowable limit values of noise are set often for an antenna terminal of an antenna switch, an input terminal of a low noise amplifier, a receiver terminal of IC and the like, for example.

Next, the analysis net selection part 415 selects a group of an analysis target net (S502). When selecting the group of an analysis target net (S502), the analysis net selection part 415 selects a group of wirings to be targeted for analysis during the interference analysis by computer simulation. The group of wirings selected here may be called a wiring pair or a net pair.

The group of wirings selected here includes a wiring giving the interference and a wiring receiving the interference. The wiring giving the interference has a terminal to which virtual noise is input and the wiring receiving the interference has a terminal receiving the noise. The terminal to which virtual noise is input is one of the terminals of the wirings for which the electrical characteristics of virtual noise have been set during the setting of virtual noise characteristics (S511). The terminal receiving the noise is one of the terminals for which the noise allowable limit values have been set during the setting of the noise allowable limit values (S512).

Herein, a concept of the wirings will be described below. In a group of selected wirings, a line connected as an electrical circuit between a terminal of a component or an element and a terminal of another component or element is considered one wiring. This concept of the wiring is called "net" in the field relating to CAD, and a net group connected as an electrical circuit via components is simply called a net. One net may include passive components such as a resistor, an inductance, a capacitor and a switch, for example.

Figure 8A:
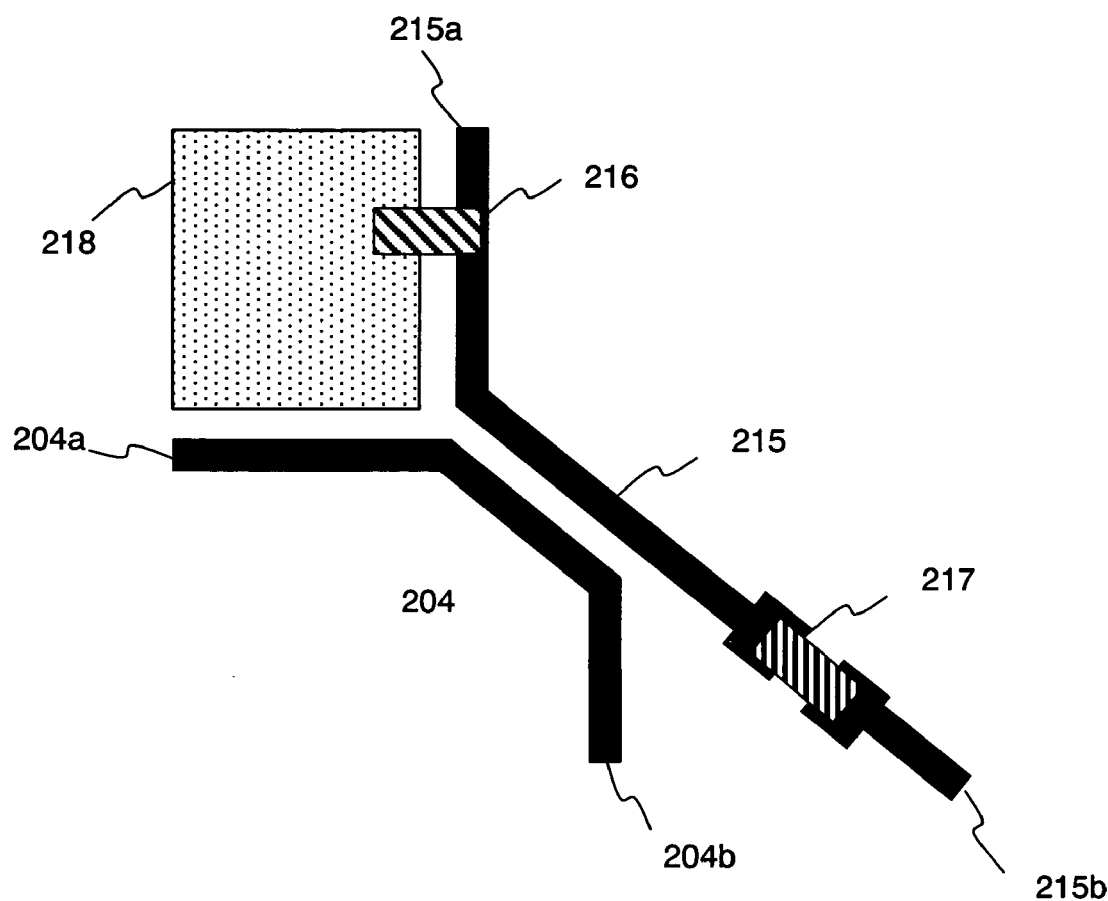
FIG. 8 shows an exemplary wiring including components.

FIG. 8A shows an exemplary wiring including components. A component 216 and a component 217 are disposed between a terminal 215*a* and a terminal 215*b*. The component 216 is connected with a ground pattern 218. The component 217 is connected in series between the terminal 215*a* and the terminal 215*b*.

The wiring 215 as a line is divided by the component 217 between the terminal 215*a* and the terminal 215*b*. However, for the interference analysis, two-terminal components such as a resistor, an inductor and a capacitor provided on a line are equivalent, in terms of an electrical circuit, to the state where the ends of the two lines are connected via an element having an impedance, and therefore the line including such components can be regarded as a continuous wiring.

Similarly, the component 216 is equivalent to the state where an element having the impedance of the component 216 is connected between the wiring and the ground. Therefore, for the interference analysis involving the terminal 215a, the component 216 can be regarded as a portion of the wiring 215.

As for a three or more-terminal component, information indicating which terminal is connected electrically with which terminal in the component may be included in the information of the component, whereby the interference between arbitrary terminals can be analyzed.

Figure 8B:
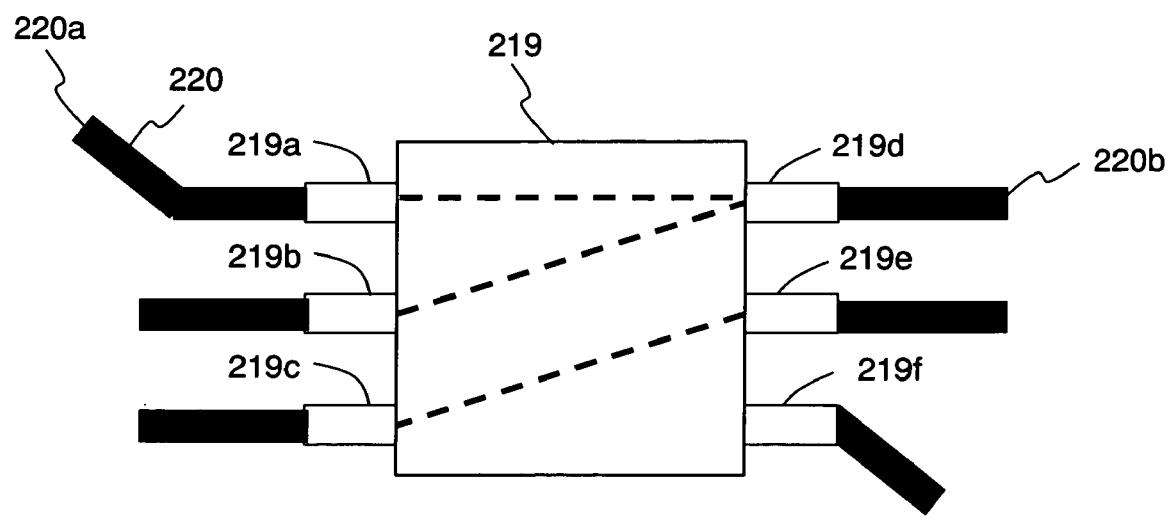

For instance, the information that a component 219 as shown in FIG. 8B should have will be described below, where the component 219 has six terminals 219a, 219b, 219c, 219d, 219e and 219f. The component can have the information indicating that the terminal 219a and the terminal 219d are connected electrically, the terminal 219b and the terminal 219d are connected electrically and the terminal 219c and the terminal 219e are connected electrically but the terminal 219f is not connected with any terminals. The electrical characteristics between the terminal 219a and the terminal 219d, between the terminal 219b and the terminal 219d and the terminal 219c and the terminal 219e can be included in the information of the component as an impedance varied in accordance with the frequency or information such as S parameters.

In this way, by letting the information of a component contain connection relationships between terminals and their electrical characteristics, a portion from a terminal 220a and a terminal 220b can be regarded as one wiring, for example.

Such information concerning components and information indicating that a portion between which terminals should be regarded as one wiring are set often at the stage of designing a circuit using a CAD or the like. Alternatively, such information concerning components may be set by the input from a designer at the above-described step of setting the analysis condition setting data (S501).

By defining the components and the wirings as stated above, the interference characteristics can be calculated with consideration given to the properties of the components. Further, the influence of the wiring via the components can be analyzed concurrently, and therefore a received noise level can be calculated more accurately. Moreover, since the number of the terminals for which the virtual noise characteristics and the noise allowable limit values are to be set can be reduced, the model for the analysis target can be simplified. In addition, since the number of the groups of the wirings to be analyzed can be reduced, the decision result output after the decision of the interference analysis result can be confirmed simply.

At the step of selecting groups of analysis target net (S502), the analysis net selection part 415 decides the necessity of frequency characteristics calculation of the interference amount (S521), and then extracts the groups of wirings for which the interference should be calculated (S522).

At the step of deciding the necessity of calculation (S521), the analysis net selection part 415 compares a virtual noise strength and a noise allowable limit value of the groups including the terminal for which the electrical characteristics of virtual noise have been set and the terminal for which the noise allowable limit value has been set, and makes a decision as to whether the noise strength exceeds the noise allowable limit value or not.

For instance, in the wiring pattern shown in FIG. 4, the noise source model of the component 211 is set for the terminal 201a of the wiring 201 as the electrical characteristics of virtual noise. Then, the noise strength at a certain frequency in this noise source model and the noise allowable limit value at the frequency that is set for the terminal 204a of the wiring 204 are compared. For instance, if the noise allowable limit value for the terminal 204a is 90% or less of the strength of the virtual noise input to the terminal 201a, then it is decided that the interference amount between the terminal 201a and the terminal 204a should be calculated. This value of 90% merely is an example, and an appropriate value preferably is adopted depending on the case. Also for other terminals, a decision concerning the necessity of calculating the interference amount between the terminals is made similarly.

At the step of the extraction of wiring groups (S522), the groups of the terminals that are decided to require calculating of the interference amount at the step of deciding the necessity of calculation (S521) are extracted. Further, all of the wirings connected electrically with the respective extracted terminals are extracted. In the case where switches and passive components such as an inductor, a capacitor, a filter and a connector are connected with the extracted wirings, the extraction may be performed while regarding, as one wiring, the net group connected as an electrical circuit via these connected components.

For instance, in FIG. 4, the wiring 201 and the wiring 204 are extracted as the group of wirings, where the wiring 201 is connected electrically with the terminal 201a for which a noise source model has been set and the wiring 204 is connected electrically with the terminal 204a for which a noise allowable limit value has been set. In this group of wirings, the wiring 201 gives the interference and the wiring 204 receives the interference.

If it is decided that the interference amount between the terminal 203a and the terminal 204a also needs to be calculated, then the wiring group of the wiring 203 and the wiring 204 is extracted, where the wiring 203 gives the interference and the wiring 204 receives the interference.

For each of the thus extracted wiring group including two wirings, i.e., for each wiring pair, the calculation of the interference amount, which will be described later, is carried out. Because the calculation is carried out for each wiring pair, the computational complexity and the time required for the analysis can be reduced as compared with the conventional analysis method that divides a board as a whole in a mesh form to carry out the calculation.

Furthermore, the wiring group may not include always two wirings, and the wiring group including two or more wirings also is possible.

In one computer simulation for the interference analysis, the calculation of the interference analysis is carried out by computer simulation assuming that, in principle, one wiring receives the interference and one or more wirings give the interference to this wiring receiving the interference.

Furthermore, instead of the above-stated selection by the calculation by the analysis net selection part 415 of the wiring group whose interference amount is to be calculated, a designer may select the wiring group whose interference amount is to be calculated through the user interface part 401.

For instance, a designer may select, as the wirings having the possibility of interfering with the wiring 204 receiving the interference, the wirings 201, 202 and 203 that are disposed adjacent to the wiring 204. For each of the terminal 201a, the terminal 202a and the terminal 203a, a noise source model is set.

The noise source models set for the respective terminals 201a, 202a and 203a are set at the step of the setting of characteristics of virtual noise (S511). The noise source models for the terminal 201a, the terminal 202a and the terminal 203a may be the same or different from each other.

These wirings including the wiring 204 receiving the interference and the wiring 201, the wiring 202 and the wiring 203 giving the interference merely are an example. In this way, with respect to one wiring receiving the interference, plural wirings may give the interference.

Although the interference analysis may be carried out for all of the wiring groups that the designer selects, the wiring groups that have the necessity of undergoing the interference analysis actually may be extracted in order to reduce the computational load. Whether the interference analysis is necessary or not can be decided based on the electrical characteristics of virtual noise that are set for the wiring giving the interference in the wiring group and the noise allowable limit value that is set for the wiring receiving the interference. In this way, the actual interference analysis may be carried out only for the extracted wiring groups, whereby the computational load can be reduced.

As stated above, at the step of selecting the group of an analysis target net (S502), a group of plural wirings, i.e., a group of a net is selected normally. The following steps of the interference analysis (S503) and the interference analysis result decision (S504) are performed for each wiring group.

For instance, in FIG. 4, it is assumed that a wiring group of the wiring 204 and the wiring 201 and a wiring group of the wiring 204 and the wiring 203 are selected. In this case, firstly, the interference amount between the terminal 204b of the wiring 204 and the terminal 201a of the wiring 201 and the interference amount between the terminal 204a and the terminal 204b are calculated (S503), and a noise level that the terminal 204b of the wiring 204 will receive is calculated. Similarly, the interference amount of the wiring group of the wiring 204 and the wiring 203 is calculated, and a noise level that the terminal 204b will receive from the wiring 203 is calculated. Thereafter, the noise level that the terminal 204b will receive from the wiring 203 and the noise level that the terminal 204b will receive from the wiring 201 are synthesized.

As a method for specifying the wiring groups that are required to undergo the interference analysis among a plurality of wirings, the following method is available in addition to the above-described method, for example: a designer may select directly wirings, wiring patterns, terminals or components on a display screen so as to specify the wirings having the necessity of undergoing the interference analysis.

Although FIG. 4 shows the wirings 205 and 206 and the ground patterns 207, 208 and 209, which are not a target of the interference analysis, according to the present embodiment, these are not selected for the wiring groups as a target for the analysis.

With the above-described various methods, the wiring groups whose interference amounts are to be calculated are extracted and determined finally (S522).

Next, the interference analysis part 416 performs the interference analysis with respect to the wirings selected at S502 (S503). The interference analysis part 416 calculates the frequency characteristics of the interference amount, i.e., the interference characteristics, obtained from the wirings pattern.

The interference amount represents the degree of the interference. For instance, the interference amount can be represented with the ratio of the strength of noise input to a terminal with the strength of the received noise when the noise is received by another terminal. The interference characteristics are represented with the interference amounts at a plurality of different frequencies.

FIG. 5B shows exemplary interference characteristics obtained from this wiring pattern.

The interference characteristics of FIG. 5B show a change of an absolute value of the interference amount between the terminal 201a of the wiring 201 and the terminal 204b of the wiring 204 in the wiring pattern of FIG. 4 in accordance with a change of the frequency.

That is, the interference characteristics of FIG. 5B represent a ratio between a noise strength given to the wiring 201 at a certain frequency and a noise strength at the wiring 204 that receives the interference at the frequency, where the ratio is represented for a plurality of different frequencies.

For instance, the example of the interference characteristics of FIG. 5B shows the following: the interference amount at the lowest frequency band is relatively large, but the interference amount decreases in accordance with the increase of the noise frequency. Then, the interference amount gradually increases in accordance with the further increase of the noise frequency, so as to have the maximum value at a certain frequency. After the maximum value of the interference amount, the interference amount decreases in accordance with the increase of the noise frequency.

The interference characteristics obtained from the wiring pattern shown in FIG. 5B merely are an example, and the pattern of a change in the interference amount is not limited to this example.

These interference characteristics can be calculated from the geometrical features of the wiring pattern. As for the specific and detailed procedure of the calculation of the interference characteristics, the whole procedure of the interference analysis (S503) can be divided roughly into four procedures including GND search (S531), segment separation (S532), connection condition derivation (S533) and S matrix calculation (S534).

In these four procedures, the interference analysis part 416 firstly conducts the GND search (S531) where the ground patterns of the wiring pattern are extracted, and then the wiring group to be analyzed is separated into segments so as to determine the circuit characteristics of the individual segments (S532). Meanwhile, the connection conditions between the separated segments are derived (S533). Based on the circuit characteristics of each segment and these connection conditions, the S matrix calculation (S534) is performed, whereby the interference amount in the wiring group to be analyzed can be obtained. The following describes the details of these procedures.

The interference analysis part 416 performs the GND search based on the design data 431 (S531). In the GND search (S531), the GND wirings present around the wirings whose interference characteristics are to be calculated, i.e., the patterns of the earth or the ground region, are extracted.

For instance, in the example of FIG. 4, assuming that the wiring group to be analyzed includes the wiring 201 and the wiring 204, then the ground patterns 207, 208 and 209, which are present in the same layer as those wirings, are extracted. In addition to these, the ground patterns present in all layers above and below the wiring pattern shown in FIG. 4 are extracted. Preferably, the ground pattern closer to the wiring 204 is extracted with priority.

Based on the design data 431, the result of the GND search and the like, the wiring separation part 417 performs the segment separation (S532). The segment separation (S532) is a procedure by which a region including the wiring group to be analyzed is separated into smaller segments. A segment is the unit for which circuit characteristics such as a S parameter and an impedance are set in the interference analysis.

For instance, according to this procedure, a region including the wirings 201 and 204 that belong to the wiring group to be analyzed and the GND wirings present around these wirings in the example of FIG. 4 are separated into small segment regions.

Figure 6A:
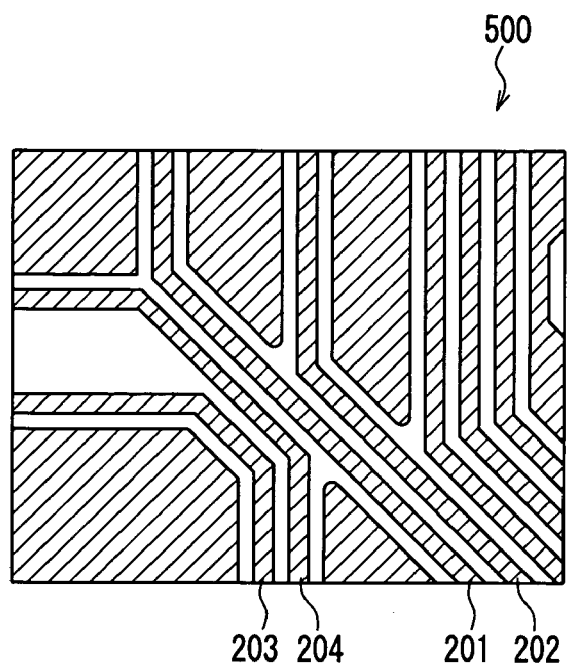
FIG. 6 shows an exemplary segment separation.
Figure 6B:
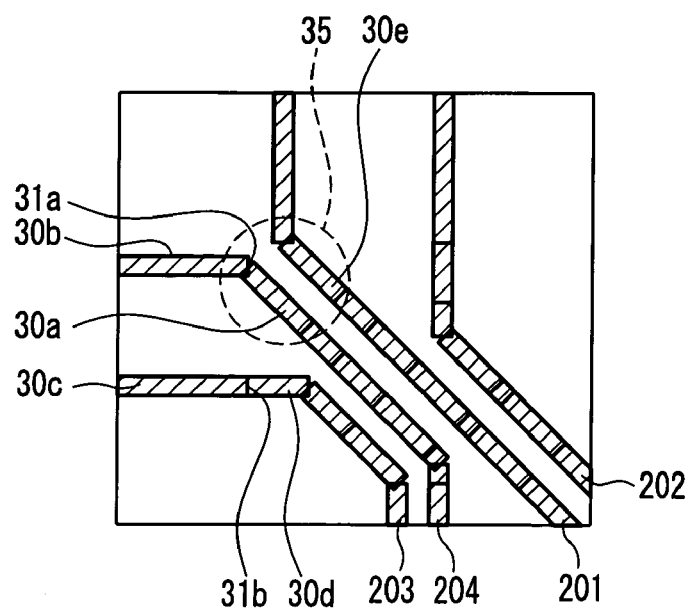

FIG. 6 shows an exemplary segment separation. FIG. 6A shows a region 500 including a wiring group to be analyzed, i.e., the region including the wiring 201 giving noise and the wiring 204 receiving the noise. The wiring separation part 417 separates the wirings 201, 202, 203 and 204 in the region 500 of FIG. 6A into a plurality of segments as shown in FIG. 6B. For instance, the wiring 204 is separated into eight segments including segments 30a and 30b.

A portion where the segments are aligned closer to each other is called a coupled line. The coupled line is a pair of lines where electromagnetic coupling that cannot be ignored is present between these lines. For instance, in FIG. 6B, the segment 30a and the segment 30e that are aligned in parallel with each other are regarded as a coupled line 35. Further, not only lines provided in the same wiring layer but also lines provided in different wiring layers may be regarded as coupled lines.

When separating a wiring group into segments, a portion where an angle of the wiring changes as in a border 31a can be used as a border. Further, as in a border 31b, a border may be set between a portion 30c where the two wirings 204 and 203 are aligned in parallel with each other and a portion 30d where the wirings are not in parallel with each other. Moreover, at a portion where the two wirings are not in parallel with each other, a portion of the intersection with a wiring in a different layer or a portion where an angle of a coupled line of the wiring group changes can be a border of segments.

For the segment separation, preferably, the separation is performed so that many groups of parallel wiring segments are present. When the segment separation is performed so that more groups of parallel wiring segments are present, the processing time can be shortened easily while maintaining high accuracy.

Further, in the segment separation, the ground patterns extracted during the GND search (S531) also are considered. For instance, a portion where a ground pattern is present either above or below the wiring and a portion where no ground pattern is present can be separated in different segments. Also, portions having ground patterns different from the above and the below of the wiring can be separated into different segments.

Further, in the case where a component 217 is disposed partway in a wiring as in the wiring 215 of FIG. 8A, such a component 217 is regarded as one segment in the segment separation.

Further, the method of the segment separation may be recorded beforehand in the storage part 403 as data representing the separation method. The data representing the separation method may contain the above-stated separation method and data representing the fineness degree of separation for the segment separation and the like.

The wiring separation part 417 determines a circuit matrix for each segment of the separated segments. The circuit matrix is, for example, a S matrix.

The S matrix (scattering matrix) specifies the characteristics of a circuit based on the magnitude and the phase of waves relating to electric power output/input with respect to the respective ports of the circuit. The respective elements in a S matrix may be called S parameters.

As one example, a four-terminal S matrix can be determined concerning the coupled line 35 made up of the segment 30a and the segment 30e of FIG. 6B.

The value of the S matrix for the coupled line 35 can be obtained by referring to the database (not illustrated) of the S matrix recorded beforehand in the storage part 403. In the S matrix database, values of various four-terminal S matrixes are stored, which correspond to wiring information such as a wiring pitch, a wiring width, a wiring length, a layer arrangement structure of a wiring in a multilayer board and a material constant of a board (e.g., a dielectric constant). The wiring separation part 417 refers to values of the four-terminal S matrix corresponding to the wiring information of the coupled line 35. That is, the S matrix corresponding to the wiring information representing the same structure as that of the coupled line 35 to be analyzed is found from the database by pattern matching or the like. Herein, the wiring information of the coupled line 35 is included in the design data 431. In this way, the four terminal circuit elements of the coupled line 35 can be obtained.

If the values of the S matrix corresponding to the wiring width, the thickness of a dielectric between wirings and ground, the distance of the coupled line in the wiring information of the coupled line 35 are not present in the S matrix database, data can be interpolated using the wiring information closer to the wiring width, the thickness of a dielectric between wirings and ground, and the distance of the coupled line in the wiring information of the coupled line 35.

Further, similarly to the coupled line, also for a single wiring that is not a coupled line, two-terminal S matrix values stored beforehand in the database are referred to so as to acquire the two-terminal circuit elements corresponding to the wiring information of such a wiring. In this way, S matrixes are obtained for the individual separated segments all from the database.

Note here that the method for determining the circuit matrix of each segment is not limited to the above method of acquiring values from the database. For instance, based on the wiring information of a segment, a circuit matrix such as a S matrix can be calculated by electromagnetic field analysis. Further, a function that returns a circuit matrix may be prepared, and a circuit matrix can be determined from this function. The wiring information of a segment may be made an argument of this function.

Figure 11A:
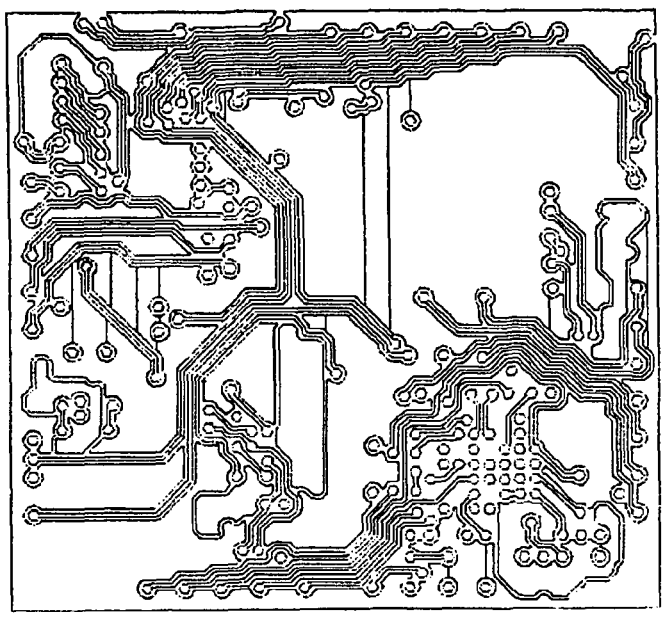
FIG. 11 shows an exemplary wiring pattern as a target of the analysis.
Figure 11B:
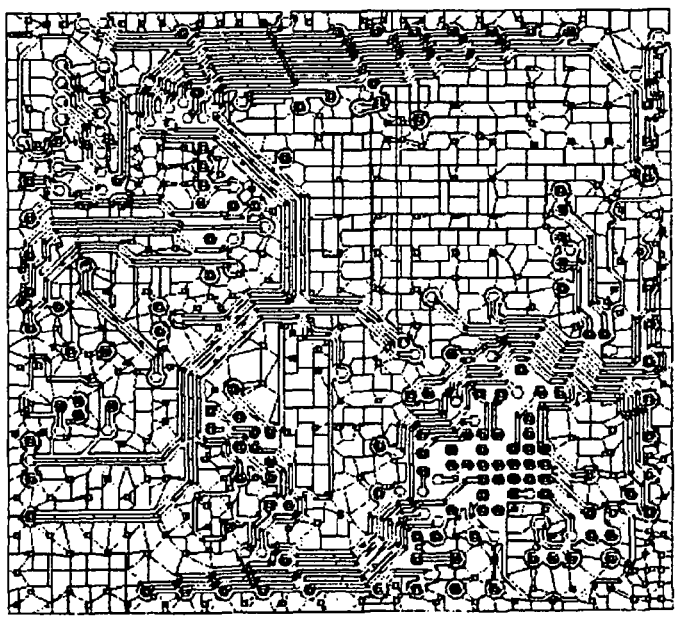

In this way, a wiring is separated into segments, and analysis is performed based on the segments, whereby the analysis at high speed with a reduced load and in a short time period is possible. That is to say, as shown in FIG. 11B, in the case where the entire region including wirings is separated into a mesh form, and electromagnetic field analysis is performed for the separated many individual pieces, an enormous processing time is required. On the other hand, in the case where a wiring becoming a target for the analysis is separated into segments and the coupled lined 35 of the segments is converted into an equivalent model, and the decision of the interference is performed based on this equivalent model as shown in FIG. 6B, then the processing time can be reduced considerably.

Herein, regarding the circuit matrix, a Z matrix, a Y matrix, a F matrix and a T matrix, for example, can be used in addition to the S matrix that is used often in the pertinent art. Z, Y, F and T parameters (i.e., parameters constituting the Z matrix, the Y matrix, the F matrix and the T matrix) and S parameters (i.e., parameters constituting the S matrix) can be mutually converted. While it is convenient to use a T parameter for the synthesis of the cascade connection of a circuit, a S parameter is more versatile because there are circuits that cannot be defined using the T parameter.

After the segment separation processing (S532), the interference analysis part 416 derives connection conditions (S533).

The connection condition derivation (S533) includes, for example, a procedure of calculating connection relationships between the separated segments and a procedure of calculating the characteristics of components connected with the wirings.

For instance, in the example shown in FIG. 4, the wiring pattern including the wiring 201 for which the noise source model is set, the wiring 204 that becomes a target of the interference analysis and the GND wirings present around these wirings are separated into smaller segment regions, and then connection relationships between these segments are calculated.

Further, the characteristics of the components connected with the respective wirings are calculated. The characteristics of the components may be represented with, for example, an impedance that changes in accordance with the frequency. For instance, the frequency characteristics of the component 217 shown in FIG. 8A, i.e., the state of the change of the impedance or the S parameter of the component 217 in accordance with the frequency, may be determined.

In the case where a plurality of components 216 and 217 are present as shown in FIG. 8A, even when the interference amount changes considerably at a specific frequency due to the resonance resulting from the characteristics among the plurality of components, the interference amount can be calculated accurately by calculating the characteristics of the components using impedances.

Further, the characteristics of terminal conditions of the components 211, 212 and 213 are calculated. The terminal conditions are electrical characteristics of a component at a terminal when the terminal of the component functions as a terminal at an end of a wiring. The characteristics of the terminal condition of the component are represented with an impedance changing in accordance with the frequency. For instance, the state of the change in the impedances of the terminals of the components 211, 212 and 213 in accordance with the frequency is determined.

The following describes an exemplary impedance of a component.

Normally, a value equal to a normalized impedance is used as an input/output impedance of a component terminal. 50 Ω normally is used as the normalized impedance. For instance, a S matrix of a wiring connected with a component is calculated assuming that an input/output impedance of a component terminal is 50 Ω. On the contrary, in the case where an input/output impedance of a component terminal is different from 50 Ω, the input/output impedance of the component terminal is used as the normalized impedance of the respective terminals, whereby interference characteristics closer to the actual one can be calculated.

As the input/output impedance Zin of a component, one defined by the following Formula 1 can be used, for example.

$$Z_{in} = R_{dev} + \frac{1}{j\omega C}$$ [Formula 1]

$R_{dev}$: real part of input impedance (Ω)
j: imaginary unit
$\omega = 2\pi f$ f: frequency (Hz) π: circular constant
C: capacitor component of a component (pF)

Further, as another example, a S parameter defined as follows with respect to the respective frequencies can be used. Assuming that S parameters of a component at 100 MHz, 200 MHz and 300 MHz are represented as $\Gamma_{100M}$, $\Gamma_{200M}$, $\Gamma_{300M}$, respectively, then the respective values can be represented by the following Formulas 2 to 4:

$$\Gamma_{100M} = Re_{100M} + j Im_{100M}$$ [Formula 2]

$$\Gamma_{200M} = Re_{200M} + j Im_{200M}$$ [Formula 3]

$$\Gamma_{300M} = Re_{300M} + j IM_{300M}$$ [Formula 4]

In the above Formulas 2 to 4, $Re_{100M}$, $Re_{200M}$ and $Re_{300M}$ denote real parts of the S parameter of the component at the frequencies of 100 MHz, 200 MHz and 300 MHz, respectively. $Im_{100M}$, $Im_{200M}$ and $Im_{300M}$ denote imaginary parts of the S parameter of the component at the frequencies of 100 MHz, 200 MHz and 300 MHz, respectively.

The S parameter of the component is converted into the impedance of the component by the following Formula 5:

$$Z_{in} = Z_o \frac{1+\Gamma}{1-\Gamma}$$ [Formula 5]

As for a terminal for which the virtual noise characteristics and the noise allowable limit values are not set, they may be terminated with the input/output impedances of the component terminal, whereby the number of the terminals can be reduced, thus simplifying the calculation.

In the case where the component is provided with a plurality of terminals, the data representing the characteristics of the component preferably is prepared beforehand for each component as the design data 431 in the form of frequency characteristics data such as a Z parameter, a Y parameter and a S parameter having ports corresponding to the terminals in number or in the form of an equivalent circuit.

In the case where the characteristics data of a component is not present at the time of the calculation of the interference characteristics, a default value set beforehand can be used as the characteristics data of the component for the calculation of the interference characteristics.

When the connection conditions for each segment can be derived, then the S parameter calculation part 418 calculates the interference amount (S534) based on these connection conditions; the GND wiring pattern obtained at the GND search (S531); and the circuit matrix (S matrix) obtained at the segment separation (S532). Since the interference amount changes in accordance with the noise frequency, the interference amount is calculated for each frequency.

The following describes an example of the thus calculated interference amount. FIG. 7 shows an example of a wiring group that becomes a target for the interference analysis. As shown in FIG. 7A, in the case where the wirings becoming the target for the analysis include the wiring 201 giving the interference and the wiring 204 receiving the interference, the number of the terminals of the wirings becomes four in total, including the terminals 201a, 201b, 204a and 204b. The interference amount between four-terminal wirings can be represented using a S parameter of four rows×four columns (e.g., see the following Formula 6).

$$S = \begin{bmatrix} S_{11} & S_{12} & S_{13} & S_{14} \\ S_{21} & S_{22} & S_{23} & S_{24} \\ S_{31} & S_{32} & S_{33} & S_{34} \\ S_{41} & S_{42} & S_{43} & S_{44} \end{bmatrix} \qquad \text{[Formula 6]}$$

The S matrix shown in the above Formula 6 can be determined, for example, by solving the electrical network in which the respective circuit elements are connected based on the electrical connection of the wiring.

Further, as shown in FIG. 7B, in the case where the wiring 201 as a target for the analysis has a branch, the interference amount is calculated among all of the terminals 201a, 201b, 201c, 204a and 204b including the terminal 201c of the branch.

In the case where the interference amount is represented with a S parameter, the terminal condition of a terminal normally represents the characteristics at the state where the terminal is terminated with a normalized impedance. However, actually, a component is connected electrically with the terminal at the end of a wiring in many cases, which has an impedance different from the normalized impedance. For that reason, it is preferable that the impedance of the component obtained at the connection condition derivation (S533) be considered for the calculation of the interference amount.

In this way, since the interference amount between terminals of wirings changes in accordance with the characteristics of a terminal condition of a component that is connected with the terminals of each wiring, it is preferable that the interference be calculated with consideration given to the terminal condition of the components.

When the interference amount is calculated by the interference analysis part 416, then the interference result decision part 419 performs the decision of the interference analysis result for deciding the presence or absence of the influence of the interference between wirings, based on the thus set and calculated values (S504).

At the decision of the interference analysis result, received noise level calculation (S541) and interference decision (S542) are performed.

The noise level calculation part 420 calculates, from the interference amount determined at the S matrix calculation (S534) and the noise strength set at the virtual noise characteristics setting (S511), a strength of received noise at the terminal for which the noise allowable limit value is set.

That is to say, at the received noise level calculation (S541), the noise source model set at the virtual noise characteristics setting (S511) and the interference amount calculated at the interference analysis (S503) are applied to the wiring group extracted at the step of selecting the group of an analysis target net (S502), whereby a received noise level at the wiring receiving the interference can be calculated.

The following describes an example of the calculated received noise level. In the wiring pattern shown in FIG. 7A, in the case where the interference amount from the terminal 201a to the terminal 204a is given as $S_{31}$, then the received noise level can be calculated by the following Formula 8, where $P_f$ denotes the noise strength of a noise source at the frequency of f and the received noise level is represented by the following Formula 7:

$$|\vec{P}'f| \qquad \text{[Formula 7]}$$

$|\vec{P}'f| = |P_f \times S_{31}|$ (this means the absolute value of $P_f \times S_{31}$) [Formula 8]

Using the above Formula 8, the received noise level can be calculated for all of the frequencies where the noise source is present.

Herein, $S_{31}$ normally includes a complex number and the received noise level can be defined using a length of a vector. For instance, assuming that the interference amount $S_{31}$ from the terminal 201a for which the virtual noise characteristics are set to the terminal 204a for which the noise allowable limit value is set is represented as Re+jIm (denotes imaginary unit), then the received noise level can be represented as the following Formula 9:

$$P \times \sqrt{Re^2 + Im^2} \qquad \text{[Formula 9]}$$

In the case where a plurality of virtual noise characteristics are set for one wiring, the value obtained by synthesizing the respective virtual noises is used. For instance, in the wiring 201 shown in FIG. 7A, electrical characteristics of virtual noise are set for each of the terminal 201a and the terminal 201b. In this case, a noise level of noise at the terminal 204a received from the terminal 201a and a noise level of noise at the terminal 204a received from the terminal 201b have to be synthesized. For the synthesize, the effective synthesize with consideration given to the phase and not the simply sum of the respective virtual noise strengths allows the accurate calculation for wirings and coupled lines. This can prevent the overestimation of the interference noise amount.

In the case where N noise sources are present and the received noise levels from the respective noise sources satisfy the following Formula 10, assuming that the synthesized received noise level is the following Formula 11, the synthesized received noise level becomes as shown in the following Formula 12 when the levels are synthesized simply. That is, in that case, the sum of the absolute values of the respective received noise levels becomes the synthesized received noise level. The following Formula 12 shows the case where the synthesized noise level becomes the maximum.

$$|\vec{P}_1|, |\vec{P}_2|, |\vec{P}_3|, |\vec{P}_4| \ldots |\vec{P}_N| \qquad \text{[Formula 10]}$$

$$|\vec{P}_{total}| \qquad \text{[Formula 11]}$$

$$|\vec{P}_{total}| = |\vec{P}_1| + |\vec{P}_2| + |\vec{P}_3| + |\vec{P}_4| + \ldots + |\vec{P}_N| \qquad \text{[Formula 12]}$$

On the other hand, in the case where the effective synthesize is performed with consideration given to the phase, the synthesized received noise levels are calculated by the following Formula 13:

$$|\vec{P}_{total}| = |\vec{P}_1 + \vec{P}_2 + \vec{P}_3 + \vec{P}_4 + \ldots + \vec{P}_N| \qquad \text{[Formula 13]}$$

That is, in the above formula 13, the absolute value of the sum of the respective received noise levels including the phase (the sum of vectors) becomes the synthesized received noise level. From the above Formula 13, the synthesized received noise level can be obtained with consideration given to the phase difference among the respective received noise levels. Thereby, the effect of preventing the overestimation of the interference noise amount can be obtained.

Further, at the above setting of virtual noise characteristics (S511), in the case where a plurality of virtual noises are set, a relative difference among the phase information concerning the generation of the respective virtual noises may be set, whereby the accuracy can be enhanced further for synthesizing the interference noise.

The phase information, which is set for the virtual noise, does not represent simply a relative difference concerning time, but has a different value for each frequency. Therefore, by setting the phase information for the virtual noise characteristics, the calculation of the interference amount can be performed with consideration given to the phase information (imaginary component) possessed by wirings and components that is different for each frequency. As a result, the received noise level can be synthesized so as to faithfully reproduce the actual measurement.

Also in the case where a plurality of wirings giving the interference are present with respect to one wiring receiving the interference, the synthesized received noise level can be obtained by the above-stated synthesize method.

As one example, the following describes the case where the wiring 204 receiving the interference and three wirings 201, 202 and 203 giving the interference are present in the wiring group targeted for the analysis. For the wiring 201, a noise source model N1 is set as the electrical characteristics of virtual noise. For the wiring 202 and the wiring 203, a noise source model N2 and a noise source model N3 are set, respectively. From the noise source model N1 and the interference amount between the wiring 204 and the wiring 201, a received noise level P1 can be calculated. From the noise source model N2 and the interference amount between the wiring 204 and the wiring 202, a received noise level P2 can be calculated. From the noise source model N3 and the interference amount between the wiring 204 and the wiring 203, a received noise level P3 can be calculated. These received noise levels P1, P2 and P3 are superimposed, whereby the synthesized received noise level at the wiring 204 receiving the interference can be calculated.

FIG. 5C shows one example of the received noise level calculated by the noise level calculation part 420. Five vertical lines g of FIG. 5C indicate the received noise levels, i.e., the strengths of the received noise levels at the wiring to be analyzed. In the example of FIG. 5C, the received noise levels are indicated at different five frequencies.

After the calculation of the received noise level, the decision part 421 performs the interference decision (S542).

At the interference decision (S542), the decision is made as to whether the noise level at the wiring receiving the interference is acceptable or not, that is, is at a level within a range where a normal operation is guaranteed or not.

More specifically, the decision part 421 compares, at a plurality of different frequencies, a received noise level at one terminal that is obtained at the received noise level calculation (S541) and the allowable limit value of noise that is set for the terminal, and decides as to whether the received noise level exceeds the noise allowable limit value or not.

For instance, the decision part 421 compares the received noise level represented by the above Formula 9 and the scalar quantity of the noise allowable limit value. As a result of the comparison, if the received noise level is larger, an error indicating the state of exceeding the allowable limit value is output as the decision result data 436. The decision result data 436 is recorded in the storage part 403.

The interference decision is performed for each wiring group that is selected as a target for the analysis at the selecting of the group of an analysis target net (S502).

The following describes an example of the interference decision, with reference to FIG. 5C.

As described above, the five vertical lines g of FIG. 5C indicate the received noise levels at the wiring receiving the interference. The alternate long and short dash line j of FIG. 5C indicates the noise allowable limit value that is set at the setting of a noise allowable limit value (S512) for the wiring receiving the interference as described above.

The received noise level g and the noise allowable limit value j, shown in FIG. 5C, are compared. For instance, if a portion h that exceeds the allowable noise level is present, it is decided that the noise level at the wiring receiving the interference is not allowable. That is, it is decided that the influence of the interference is at a level beyond the range where a normal operation of a circuit including the wiring is guaranteed.

On the contrary, as a result of the comparison, if no portion exceeding the allowable noise level is present (not illustrated), then it is judged that the noise level at the wiring receiving the interference is allowable. That is, it is decided that the influence of the interference is at a level within the range where a normal operation of a circuit including the wiring is guaranteed.

The interference result output part 422 outputs the decision result by the interference result decision part 419 (S505).

The interference result output part 422 outputs the interference analysis result for each wiring pair, which is decided at the interference analysis result decision (S504), to various output equipment including a display device and a recording device, etc.

The interference result output part 422 is capable of, for example, high-light displaying of a portion, for which the interference decision decided that the received noise level exceeds the allowable level, with the color in accordance with the excessive level. Further, information such as the net name, the terminal name, the component name, the excessive level amount, and the position of the interference region may be output as a log of the interference decision.

In addition to the above high-light displaying, other displaying methods of the analysis result are available: for example, the results may be displayed with a gray-scale image provided with a difference in brightness or may be displayed with blinking whose on/off time period is changed. Further, abstract displaying also is available, including magnified display of an error portion, indication of an error portion with a pointer, display of error portions only, surrounding an error portion with a block and the like. Moreover, in addition to these displaying, or aside from these displaying, sound guidance may be performed.

For the output of the analysis results, in the case where a plurality of portions are to be emphasized, the plurality of error portions may be displayed successively on the screen display output. Further, the plurality of error portions may be divided to be displayed in a plurality of screens, or labels may be attached to the plurality of error portions on the same screen, whereby the error portions are classified for display.

The unit of these displays may be the net unit, the stroke unit from a specific wiring end to a pin or a branched portion, the wiring unit between pins and the like.

It is preferable that a user directly confirm and acknowledge the interference analysis results output to the display device. Further, it is preferable that the interference analysis result output to a recording device be stored as data, so as to allow the confirmation later or the utilization for other processing.

The values and the data in the present embodiment may be recorded on various recording means such as various RAMs and ROMs that are semiconductor memories. This recording means may be connected with a computer that performs processing of the present embodiment or may be included in the computer. The processing and the procedures of the present embodiment are executed by the computer in accordance with programs recorded in this recording means. At this time, the values and the data recorded on the recording means are used. The results of the processing and the procedures of the present embodiment are output to various input/output devices connected with or included in a computer.

As the computer, the recording means and the input/output device used in the present embodiment, common and general-purpose ones may be used, and therefore their illustration and explanations are omitted.

As described above, according to the interference analysis method, the interference analysis device, the interference analysis program and the recording medium with an interference analysis program recorded thereon of the present invention, the interference between wirings can be analyzed at high speed, with a reduced load and in a short time period. As a result, the technical effect of reducing the time and the cost required for designing a circuit having wirings can be obtained.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. An interference analysis device that analyzes interference due to electromagnetic induction between wirings of a circuit board by computer simulation, the interference analysis device comprising:
   a design data input part for inputting design data of the circuit board, the design data containing data representing a shape of the wirings and properties of an element or a component connected with the wirings;
   a noise characteristics setting part that sets noise characteristics data representing electrical characteristics of virtual noise input to a terminal of at least one wiring among the wirings of the circuit board, based on data that are contained in the design data and represent properties of an element or a component connected with the terminal;
   a limit value setting part that sets an allowable limit value of noise received by a terminal of at least one wiring among the wirings of the circuit board, based on data that are contained in the design data and represent properties of an element or a component connected with the terminal;
   a selection part that, for a group including a terminal for which the noise characteristics data have been set and a terminal for which the noise allowable limit value has been set, compares strength of the virtual noise at a frequency set by the noise characteristics data and the noise allowable limit value at the frequency so as to decide whether calculation of an interference amount is to be performed, and extracts a group of wirings that are connected with a group of the terminals and for which the calculation is to be performed;
   an interference analysis part that calculates, concerning the group of wirings extracted by the selection part, the interference amount that represents a degree of interference from the terminal to which the virtual noise is input to the terminal that receives the noise; and
   a received noise level calculation part that calculates, based on the interference amount and the noise characteristics data, a noise level that the terminal that receives the noise will receive;
   wherein the group of wirings has two or more wirings.

2. The interference analysis device according to claim 1, further comprising a decision part that decides as to whether the interference occurring in the wiring group selected by the selection part poses a problem or not by comparing the noise level calculated by the received noise level calculation part and the allowable limit value.

3. The interference analysis device according to claim 1,
   wherein the noise characteristics data represents a strength of the virtual noise that is provided for each of a plurality of different frequencies, and
   the interference analysis part calculates the interference amount for each of the plurality of different frequencies.

4. The interference analysis device according to claim 1, wherein the allowable limit value is provided for each of a plurality of different frequencies.

5. The interference analysis device according to claim 1, wherein the interference analysis part calculates the interference amount by using data representing properties of a component disposed partway in at least one wiring of the wirings included in the wiring group to be analyzed.

6. The interference analysis device according to claim 5, wherein the data representing properties of a component disposed partway in at least one wiring of the wirings included in the wiring group to be analyzed represents an impedance or a S parameter that is provided for each of a plurality of different frequencies.

7. The interference analysis device according to claim 1, wherein the interference analysis part calculates the interference amount by using data representing a terminal condition of an element or a component connected with at least one of terminals of the wirings included in the wiring group to be analyzed.

8. The interference analysis device according to claim 7, wherein the terminal condition is represented with impedances or S parameters for a plurality of different frequencies.

9. The interference analysis device according to claim 1,
   wherein in the case where the wiring group selected by the selection part includes a plurality of terminals of wirings giving the interference,
   the interference analysis part calculates, concerning each of the terminals of the wirings giving the interference, an amount of interference that is given to the terminal of the wiring receiving the interference, and
   the received noise level calculation part calculates the received noise level by synthesizing a plurality of received noise levels that the terminal of the wiring receiving the interference receives from the respective plurality of terminals of the wirings giving the interference.

10. The interference analysis device according to claim 9, wherein when the received noise level calculation part synthesizes the plurality of received noise levels, the synthesis is performed with consideration given to a phase of the noise.

11. The interference analysis device according to claim 1, wherein the wirings to be analyzed concerning the interference are wirings of a printed circuit board or wirings in a LSI.

12. An interference analysis method for analyzing interference due to electromagnetic induction between wirings of a circuit board by computer simulation, the interference analysis method comprising:
   a design data input step of inputting design data of the circuit board, the design data containing data representing a shape of the wirings and properties of an element or a component connected with the wirings;
   a noise characteristics setting step of setting noise characteristics data representing electrical characteristics of virtual noise input to a terminal of at least one wiring among the wirings of the circuit board, based on data that are contained in the design data and represent properties of an element or a component connected with the terminal;

a limit value setting step of setting an allowable limit value of noise received by a terminal of at least one wiring among the wirings of the circuit board, based on data that are contained in the design data and represent properties of an element or a component connected with the terminal;

a selection step of comparing, for a group including a terminal for which the noise characteristics data have been set and a terminal for which the noise allowable limit value has been set, strength of the virtual noise at a frequency set by the noise characteristics data and the noise allowable limit value at the frequency so as to decide whether calculation of an interference amount is to be performed, and extracting a group of wirings that are connected with a group of the terminals and for which the calculation is to be performed;

an interference analysis step of calculating, concerning the group of wirings extracted by the selection step, the interference amount that represents a degree of interference from the terminal to which the virtual noise is input to the terminal that receives the noise; and a received noise level calculation step of calculating, based on the interference amount and the noise characteristics data, a noise level that the terminal that receives the noise will receive, wherein the group of wirings has two or more wirings.

13. The interference analysis method according to claim 12, further comprising a decision step of deciding as to whether the interference occurring in the wiring group selected at the selection step poses a problem or not by comparing the noise level calculated at the received noise level calculation step and the allowable limit value.

14. A computer readable recording medium that records an interference analysis program that makes a computer execute a procedure of analyzing interference due to electromagnetic induction between wirings of a circuit board by simulation, the procedure comprising:

a design data input processing of inputting design data of the circuit board, the design data containing data representing a shape of the wirings and properties of an element or a component connected with the wirings;

a noise characteristics setting processing of setting noise characteristics data representing electrical characteristics of virtual noise input to a terminal of at least one wiring among the wirings of the circuit board, based on data that are contained in the design data and represent properties of an element or a component connected with the terminal;

a limit value setting processing of setting an allowable limit value of noise received by a terminal of at least one wiring among the wirings of the circuit board, based on data that are contained in the design data and represent properties of an element or a component connected with the terminal;

a selection processing of comparing, for a group including a terminal for which the noise characteristics data have been set and a terminal for which the noise allowable limit value has been set, strength of the virtual noise strength at a frequency set by the noise characteristics data and the noise allowable limit value at the frequency so as to decide whether calculation of an interference amount is to be performed, and extracting a group of wirings that are connected with a group of the terminals and for which the calculation is to be performed;

an interference analysis processing of calculating, concerning the group of wirings extracted at the selection processing, the interference amount that represents a degree of interference from the terminal to which the virtual noise is input to the terminal that receives the noise; and a received noise level calculation processing of calculating, based on the interference amount and the noise characteristics data, a noise level that the terminal that receives the noise will receive, wherein the group of wirings has two or more wirings.

15. The recording medium with the interference analysis program recorded thereon according to claim 14, wherein the interference analysis program makes a computer further execute a decision processing of deciding as to whether the interference occurring in the wiring group selected at the selection processing poses a problem or not by comparing the noise level calculated at the received noise level calculation processing and the allowable limit value.

* * * * *